(12) United States Patent
Zhang et al.

(10) Patent No.: US 11,923,486 B2
(45) Date of Patent: Mar. 5, 2024

(54) LIGHT-EMITTING DIODE AND LIGHT-EMITTING MODULE

(71) Applicant: KAISTAR Lighting(Xiamen) Co., Ltd., Xiamen (CN)

(72) Inventors: Jing-Qiong Zhang, Xiamen (CN); Ben-Jie Fan, Xiamen (CN); Hung-Chih Yang, Xiamen (CN); Shuen-Ta Teng, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 17/868,995

(22) Filed: Jul. 20, 2022

(65) Prior Publication Data

US 2023/0011887 A1    Jan. 12, 2023

Related U.S. Application Data

(63) Continuation of application No. 16/905,977, filed on Jun. 19, 2020, now Pat. No. 11,424,393, which is a (Continued)

(30) Foreign Application Priority Data

Apr. 19, 2019  (CN) .......................... 201910318051.1
May 22, 2020  (CN) .......................... 202010442369.3

(51) Int. Cl.
*H01L 33/50* (2010.01)
*H01L 33/08* (2010.01)
*H01L 33/06* (2010.01)

(52) U.S. Cl.
CPC ............ *H01L 33/504* (2013.01); *H01L 33/06* (2013.01); *H01L 33/08* (2013.01)

(58) Field of Classification Search
CPC ....... H01L 33/504; H01L 33/08; H01L 33/50; H01L 33/04–06; H01L 33/16
See application file for complete search history.

(56) References Cited

U.S. PATENT DOCUMENTS 8,022,388 B2    9/2011  Brandes
8,575,592 B2    11/2013 Bergmann et al.
(Continued)

FOREIGN PATENT DOCUMENTS

| CN | 102623595 A | 8/2012 |
| CN | 102822995 A | 12/2012 |
| CN | 105514235 A | 4/2016 |

OTHER PUBLICATIONS

USPTO, Office Action dated Jan. 4, 2023 for U.S. Appl. No. 17/590,098.

*Primary Examiner* — Mohammad A Rahman
(74) *Attorney, Agent, or Firm* — Li & Cai Intellectual Property (USA) Office

(57) ABSTRACT

A light-emitting module and a light-emitting diode are provided. The light-emitting diode includes an epitaxial light-emitting structure to generate a light beam with a broadband blue spectrum. A spectrum waveform of the broadband blue spectrum has a full width at half maximum (FWHM) larger than or equal to 30 nm. The spectrum waveform has a plurality of peak inflection points, and a difference between two wavelength values to which any two adjacent ones of the peak inflection points respectively correspond is less than or equal to 18 nm.

15 Claims, 23 Drawing Sheets

Related U.S. Application Data continuation-in-part of application No. 16/629,367, filed as application No. PCT/CN2019/117645 on Nov. 12, 2019, now Pat. No. 11,257,980.

(56) References Cited

U.S. PATENT DOCUMENTS

| | | |
|---|---|---|
| 2009/0206322 A1 | 8/2009 | Brandes |
| 2013/0082238 A1 | 4/2013 | Hsieh et al. |
| 2014/0284649 A1 | 9/2014 | Baumgartner et al. |
| 2020/0347999 A1* | 11/2020 | Li ........................... H01L 33/62 |

* cited by examiner

LIGHT-EMITTING DIODE AND LIGHT-EMITTING MODULE

CROSS-REFERENCE TO RELATED PATENT APPLICATION

This application is a continuation application of U.S. application Ser. No. 16/905,977, which is a continuation-in-part application of U.S. Application Ser. No. 16/629,367, which is a US national stage application of International Patent Application No. PCT/CN2019/117645, with an international filing date of Nov. 12, 2019, and which is incorporated by reference herein in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting diode and a light-emitting module, and more particularly to a light-emitting diode for generating light with a broadband spectrum and a light-emitting module using the same.

BACKGROUND OF THE DISCLOSURE

In the conventional technology, white light is generally generated by using a narrowband blue light emitting diode (LED) to excite phosphor to serve as a lighting source or a displaying light source. In a spectrum of white light generated by the aforementioned approach, a spectrum waveform has a sharp peak with high intensity in the blue light wavelength band. Therefore, it is still a trend in development in this industry to modify a spectrum waveform of the white light at the blue light wavelength band that is generated by using a blue light-emitting diode.

Furthermore, when a current for driving the blue light-emitting diode is varied, the white light spectrum that is generated by the blue light-emitting diode and the phosphor may fluctuate too much in the blue light wavelength band, which causes changing of various indicators of the color rendering index, and then may fail to satisfy the requirements in practical applications. That is to say, for the spectrum of white light generated by using a blue light-emitting diode, under a situation where the operating current is changed, the stability of the spectrum waveform at the blue light wavelength band still has room for improvement.

SUMMARY OF THE DISCLOSURE

In response to the above-referenced technical inadequacies, the present disclosure provides a light-emitting diode and a light-emitting module so as to optimize a spectrum waveform of a white light spectrum at blue light wavelength band and improve the stability of the spectrum waveform of the white light spectrum under a situation where the operating current is changed.

In one aspect, the present disclosure provides a light-emitting module including a light-emitting diode that includes an epitaxial light-emitting structure to generate a light beam with a broadband blue spectrum. A full width at half maximum (FWHM) of a spectrum waveform of the broadband blue spectrum is larger than or equal to 30 nm. The spectrum waveform has a plurality of peak inflection points, and a difference between two wavelength values to which any two adjacent ones of the peak inflection points respectively correspond is less than or equal to 18 nm.

In another aspect, the present disclosure provides a light-emitting diode including an epitaxial light-emitting structure to generate a light beam with a broadband blue spectrum. The epitaxial light-emitting structure includes a P-type semiconductor layer, an N-type semiconductor layer, and a light-emitting stack interposed between the P-type semiconductor layer and the N-type semiconductor layer. The light-emitting stack includes m layers of well layers and m+1 layers of barrier layers, and the well layers and the barrier layers are alternately stacked. The well layers includes at least five well layers with different energy band gaps, being at least one first well layer, at least one second well layer, at least one third well layer, at least one fourth well layer, and at least one fifth well layer, so as to respectively generate a first sub-light beam with a first wavelength, a second sub-light beam with a second wavelength, a third sub-light beam with a third wavelength, a fourth sub-light beam with a fourth wavelength, and a fifth sub-light beam with a fifth wavelength, the fifth wavelength being longest, and the first wavelength being the shortest. At least one of x number of the well layers that are the closest to the N-type semiconductor layer is the fifth well layer, x and m each being a positive integer, and satisfying the following equation: $x \leq (m/3)$.

In conclusion, one of the advantages of the present disclosure is that in the light-emitting diode Z12 of the light-emitting module Z1 of the embodiment provided in the present disclosure, by the technical features of "the light-emitting stack of the epitaxial light-emitting structure including m layers of well layers and m+1 layers of barrier layers which are alternately stacked, in which the well layers includes at least five well layers with different energy band gaps, being the first to fifth well layers, to generate first to fifth sub-light beams with different wavelengths," and "at least one of x number of the well layers that are the closest to the N-type semiconductor layer being the fifth well layer, x and m each being a positive integer, and satisfying the following equation: $x \leq (m/3)$," and "a broadband blue spectrum of the light beam having a FWHM larger than or equal to 30 nm and a plurality of peak inflection points, and a difference between two wavelength values to which any two adjacent ones of the peak inflection points respectively correspond being less than or equal to 18 nm," the affect resulting from a variation of the operating current density on the spectrum waveform of the white light spectrum of the mixed light generated by the light-emitting module can be attenuated. That is to say, for the white light spectrum generated by the light-emitting module of the present disclosure, a spectrum waveform at the blue light wavelength band has a better stability even if the operating current density is changed.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
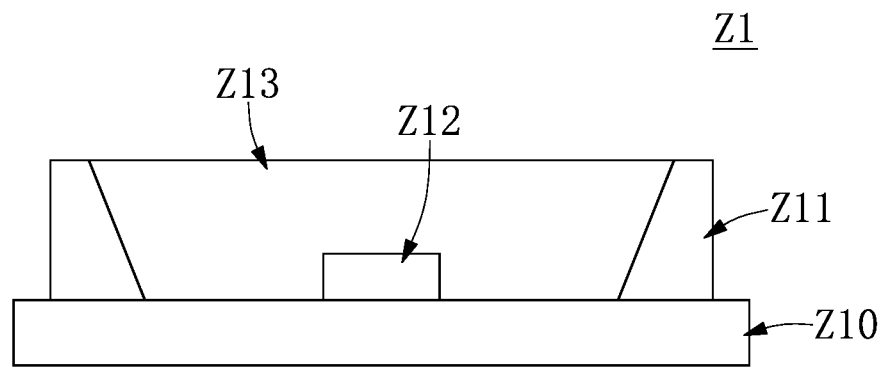
FIG. 1 is schematic cross-sectional view of a light-emitting module according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a schematic cross-sectional view of a light-emitting module according to an embodiment of the present disclosure. In the instant embodiment, the light-emitting module Z1 is used to generate white light. As shown in FIG. 1, the light-emitting module Z1 includes a substrate Z10, a reflective assembly Z11, a light-emitting diode Z12, and a wavelength conversion layer Z13. The substrate Z10 has a die-bonding area defined thereon. In an embodiment, the material of the substrate Z10 can be made of a material having a high thermal conductivity, and a high reflectivity and a low transmittance for visible light, such as metal or ceramic. In another embodiment, the substrate Z10 can include a high thermally conductive base and a reflective layer coated thereon. The material of the substrate Z10 is not limited to being a single or composite material in the present disclosure.

The reflective assembly Z11 and the light-emitting diode Z12 are jointly disposed on the substrate Z10 so that a light beam generated by the light-emitting diode Z12 can be reflected and guided toward a specific direction. The reflective assembly Z11 surrounds the die-bonding area so as to define an accommodating space.

The light-emitting diode Z12 is located at the die-bonding area of the substrate Z10 and positioned in the accommodating space defined by the reflective assembly Z11. The light-emitting diode Z12 is used to generate a light beam with a broadband blue spectrum. The full width at half maximum (FWHM) of a spectrum waveform of the broadband blue spectrum of the light beam is greater than 30 nm.

In an embodiment, the light-emitting module Z1 includes at least one light-emitting diode Z12. However, in another embodiment, the light-emitting module Z1 can includes a plurality of light-emitting diodes Z12 for generating a plurality of blue light beams with different peak wavelengths, respectively. The blue light beams with different peak wavelengths are mixed so as to produce a broadband blue light beam.

The wavelength conversion layer Z13 is filled into the space defined by the reflective assembly Z11 and covers the light-emitting component Z12. After the broadband blue light beam generated by the light-emitting component Z12 passes through the wavelength conversion layer Z13, a mixed light (white light) can be generated.

In an embodiment, the wavelength conversion layer Z13 includes at least a green phosphor and a red phosphor. The material of the green phosphor can include lutetium aluminum garnet (LuAG) or gallium yttrium aluminum garnet (YGaAG) phosphors, and the red phosphor can be made of aluminum silicon nitride compound (such as calcium aluminum silicon nitride (CASN) compound or strontium-silicon nitride compound ($Sr_2Si_5N_8$) or sulfur selenium compound ($Ca_2SeS$) or potassium hexafluorosilicate doped with $Mn^{4+}$ ($K_2SiF_6:Mn^{4+}$, KSF). In another embodiment, the wavelength conversion layer Z13 can further include yellow phosphor, and the present disclosure is not limited thereto. The material of the yellow phosphor can be, for example, yttrium aluminum garnet (YAG).

Figure 2:
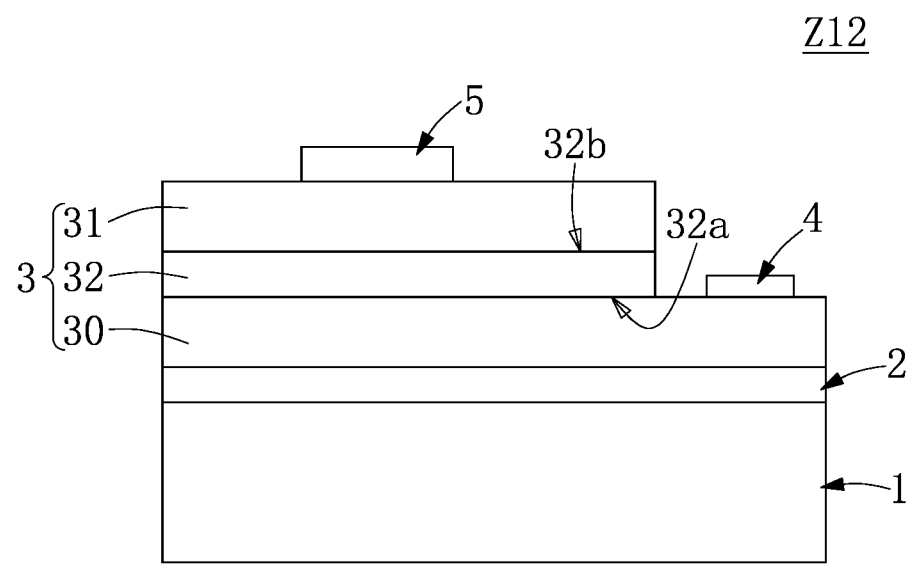
FIG. 2 is a schematic cross-sectional view of a light-emitting diode according to a first embodiment of the present disclosure.
Figure 3:
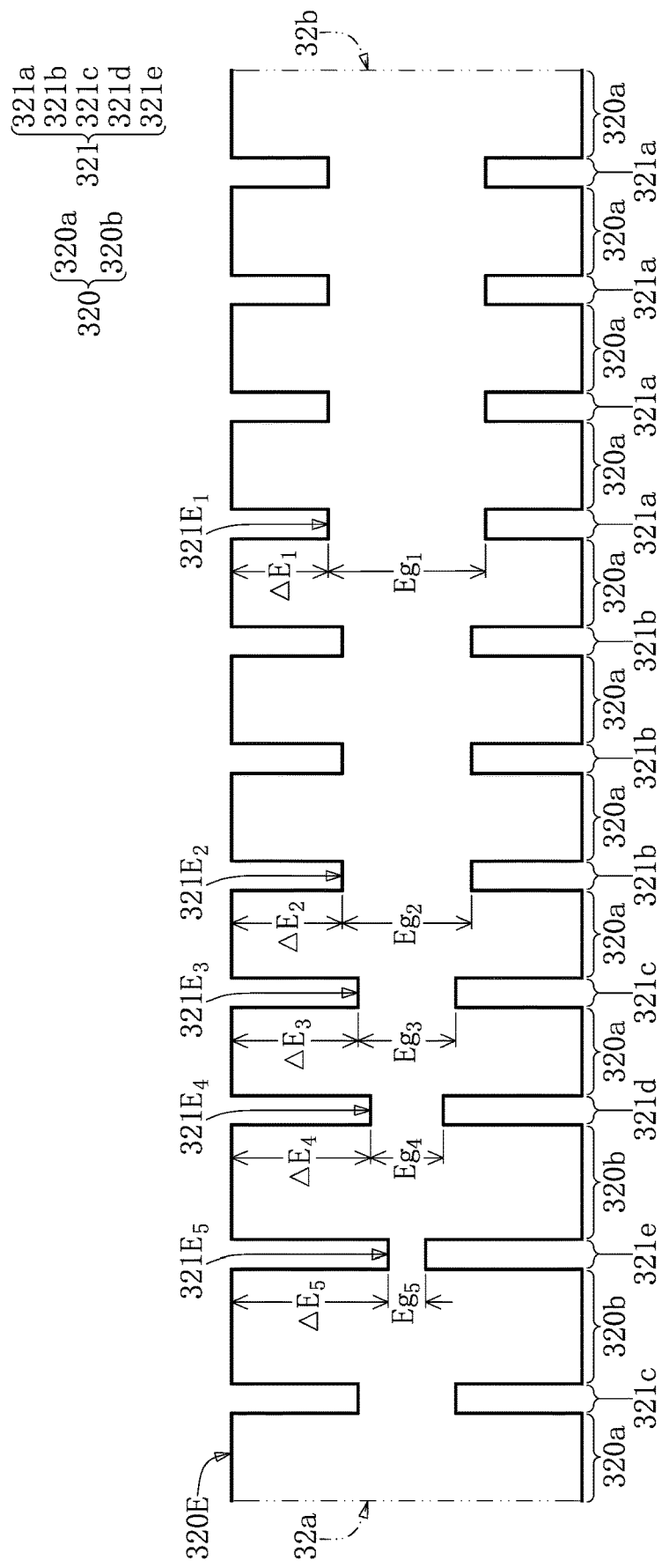
FIG. 3 is a schematic energy band diagram of the light-emitting stack according to the first embodiment of the present disclosure.

It should be mentioned that light beams with wavelengths respectively falling within different wavebands may result in different excitation efficiencies of the green phosphor. Based on the material of the green phosphor, light with a wavelength falling within a specific waveband may result in an optimum excitation efficiency of the green phosphor. As mentioned above, in the present embodiment, the light-emitting diode Z12 can generate the light beam with a broadband blue spectrum. The detailed structure of the light-emitting diode of one embodiment of the present disclosure is described below. Reference is made to FIG. 2 and FIG. 3, in which FIG. 2 is a schematic cross-sectional view of a light-emitting diode according to a first embodiment of the present disclosure, and FIG. 3 is a schematic energy band diagram of the light-emitting stack according to the first embodiment of the present disclosure.

The light-emitting diode Z12 of the embodiments of the present disclosure includes a base 1, a buffer layer 2, an epitaxial light-emitting structure 3, a first electrode 4 and a second electrode 5. The material of the base 1 is suitable for epitaxial growth, such as sapphire, silicon carbide, gallium nitride or silicon. In the present embodiment, the material of the substrate 1 is sapphire. The buffer layer 2 is formed on the base 1 by an epitaxial process, and a lattice constant of the buffer layer 2 matches those of the materials of the base 1 and the epitaxial light-emitting structure 3. In an embodiment, the material of the buffer layer 2 may be aluminum nitride or gallium nitride.

Reference is further made to FIG. 2. The epitaxial light-emitting structure 3 is disposed on the buffer layer 2 and includes an N-type semiconductor layer 30, a P-type semiconductor layer 31, and a light-emitting stack 32. In the present embodiment, the N-type semiconductor layer 30 is disposed on the buffer layer 2, and the light-emitting stack 32 and the P-type semiconductor layer 31 are sequentially disposed on the N-type semiconductor layer 30.

Furthermore, the cross-sectional widths of the light-emitting stack 32 and the P-type semiconductor layer 31 are both smaller than that of the N-type semiconductor layer 30, so that a portion of the N-type semiconductor layer 30 is exposed. That is to say, the light-emitting stack 32 and the P-type semiconductor layer 31 jointly form a mesa portion. However, the embodiment depicted in FIG. 2 is not used to limit the scope of the present disclosure. In another embodiment, the positions of the N-type semiconductor layer 30 and the P-type semiconductor layer 31 can be exchanged with each other.

The first electrode 4 and the second electrode 5 are electrically connected to the N-type semiconductor layer 30 and the P-type semiconductor layer 31 for being electrically connected to an external control circuit. In the present embodiment, the first electrode 4 is disposed on the N-type semiconductor layer 30, and the second electrode 5 is disposed on the P-type semiconductor layer 31 (i.e., on the mesa portion).

To be more specific, the N-type semiconductor layer 30 and the P-type semiconductor layer 31 can respectively serve as an electron injection layer and a hole injection layer for providing electrons and holes. In one embodiment, the material of the N-type semiconductor layer 30 is gallium nitride doped with silicon. In addition, the material of the P-type semiconductor layer 31 is gallium nitride doped with magnesium or aluminum gallium nitride doped with magnesium.

The light-emitting stack 32 is interposed between the N-type semiconductor layer 30 and the P-type semiconductor layer 31 and has a first side 32a connected to the N-type semiconductor 30 and a second side 32b connected to the P-type semiconductor layer 31. The light-emitting stack 32 is used to generate a light beam with a broadband blue spectrum. Specifically, by applying a bias between the first electrode 4 and the second electrode 5 through the external control circuit, a current passing through the N-type semiconductor layer 30, the light-emitting stack 32 and the P-type semiconductor layer 31 can be generated, so that the light-emitting stack 32 is excited and then generates the light beam with a specific waveband.

In the present embodiment, the broadband blue spectrum of the light beam generated by the light-emitting stack 32 has a broader full width at half maximum (FWHM), and at least three peak inflection points. In an embodiment, the FWHM of a spectrum waveform of the broadband blue spectrum of the light beam is greater than or equal to 30 nm.

Furthermore, in the broadband blue spectrum, a difference between two wavelengths to which any two adjacent ones of the peak inflection points respectively correspond is less than or equal to 18 nm. The detailed structure of the light-emitting stack 32 for generating the light beam with the aforementioned broadband blue spectrum will be further explained in the following descriptions.

Reference is made to FIG. 3. The light-emitting stack 32 has a multiple quantum well structure. That is to say, the light-emitting stack 32 includes a plurality of barrier layers 320 and a plurality of well layers 321 which are alternately stacked. The energy band gap of each of the barrier layers 320 is greater than the energy band gap of any one of the well layers 321, so that the light-emitting stack 32 has a multiple quantum well structure. In the embodiment of the present disclosure, the light-emitting stack 32 includes m layers of the well layers 321 and m+1 layers of the barrier layers 320, m being a positive integer. In other words, each of the well layers 321 is connected between two of the barrier layers 320, and each one of the N-type semiconductor layer 30 and the P-type semiconductor layer 31 is connected to one of the barrier layers 320.

In the instant embodiment, it is not necessary for the well layers 321 to have the same energy band gap, i.e., the well layers 321 may have different energy band gaps to generate a plurality of sub-light beams with different wavelengths. The sub-light beams are mixed to form the light beam with the broadband blue spectrum.

As shown in FIG. 3, the well layers 321 includes at least five well layers 321a-321e respectively with different energy band gaps $Eg_1$-$Eg_5$, so that a spectrum waveform of the broadband blue spectrum of the light beam generated by the light-emitting stack 32 has a broader full width at half maximum (FWHM) and a plurality of peak inflection points.

Specifically, the well layers 321 can include at least one first well layer 321a, at least one second well layer 321b, at least one third well layer 321c, at least one fourth well layer 321d, and at least one fifth well layer 321e. The first to fifth well layers 321a-321e respectively have different energy band gaps so as to generate a first sub-light beam with a first wavelength, a second sub-light beam with a second wavelength, a third sub-light beam with a third wavelength, a fourth sub-light beam with a fourth wavelength, and a fifth sub-light beam with a fifth wavelength.

It should be noted that despite the first to fifth well layers 321a-321e have different energy band gaps $Eg_1$-$Eg_5$, the first to fifth sub-light beams respectively generated by the first to fifth well layers 321a-321e respectively have the first to fifth wavelengths falling within the blue light wavelength band. However, the first to fifth wavelengths of the first to fifth sub-light beams are different.

To be more specific, the barrier layer 320 is a gallium nitride (GaN) layer, and the well layer 321 is a gallium indium nitride ($In_xGa_{1-x}N$) layer. Since the indium concentration of the well layer 321 affects the energy band gap of the well layer 321, the energy band gap of the well layer 321 can be adjusted by controlling the indium concentration of each well layer 321, so as to control the wavelength of the sub-light beam generated by the well layer 321. Reference is made to the Table 1 below. Table 1 shows the relationships between the indium concentrations (%) and a wavelength of the sub-light beam that is calculated by theoretical calculation.

TABLE 1

| Wavelength (nm) | | | | | | | | |
|---|---|---|---|---|---|---|---|---|
| 420 | 425 | 430 | 435 | 440 | 445 | 450 | 455 | 460 |
| Indium concentration (%) |
| 10.7 | 11.6 | 12.4 | 13.3 | 14.1 | 14.9 | 15.7 | 16.5 | 17.3 |

| Wavelength (nm) | | | | | | | |
|---|---|---|---|---|---|---|---|
| 465 | 470 | 475 | 480 | 485 | 490 | 495 | 500 |
| Indium concentration (%) |
| 18.1 | 18.8 | 19.6 | 20.3 | 21.1 | 21.8 | 22.5 | 23.2 |

It can be observed in Table 1 that the higher the indium concentration of the well layer 321 is, the longer the wavelength of the sub-light beam generated therefrom is. As shown in FIG. 3, in the instant embodiment, the energy band gap $Eg_1$ of the first well layer 321a is the largest, and the energy band gap $Eg_5$ of the fifth well layer 321e is the narrowest. Accordingly, a first indium concentration of the first well layer 321a is the lowest, and a fifth indium of the fifth well layer 321e is the highest.

Furthermore, the energy band gap $Eg_2$ of the second well layer 321b is larger than the energy band gap $Eg_3$ of the third well layer 321c, and the energy band gap $Eg_3$ of the third well layer 321c is larger than the energy band gap $Eg_4$ of the fourth well layer 321d. That is to say, in the instant embodiment, the energy band gaps $Eg_1$-$Eg_5$ of the first to fifth well layers 321a-321e satisfy the following width relationships: $Eg_1>Eg_2>Eg_3>Eg_4>Eg_5$. Accordingly, a second indium concentration of the second well layer 321b is lower than a third indium concentration of the third well layer 321c, and the third indium concentration of the third well layer 321c is lower than a fourth indium concentration of the fourth well layer 321d.

The energy band gap of the well layer 321 is inversely proportional to the wavelength of the sub-light beam generated therefrom. That is, the larger the energy band gap of the well layer 321 is, the shorter the wavelength of the sub-light beam generated by the well layer is. Accordingly, the first wavelength is shortest, and the fifth wavelength is longest. Furthermore, the second wavelength is shorter than the third wavelength, and the third wavelength is shorter than the fourth wavelength.

In the instant embodiment, the first wavelength is less than or equal to 435 nm, preferably, from 425 nm to 435 nm. The second wavelength ranges from 430 nm to 450 nm, preferably, from 435 nm to 445 nm. The third wavelength ranges from 442 nm to 465 nm, preferably, from 450 nm to 460 nm. The fourth wavelength ranges from 455 nm to 475 nm, preferably, from 455 nm to 465 nm. The fifth wavelength is greater than or equal to 470 nm, preferably, from 470 nm to 485 nm.

In order to obtain a required spectrum waveform of the blue spectrum, the energy band gaps of the well layers 321 can be adjusted such that a difference range between any two of the first to fifth wavelengths (for example, a difference range between the first and second wavelengths, the first and third wavelengths, or the second and third wavelengths).

As shown in FIG. 3, a first barrier height $\Delta E_1$ is formed between a conduction band $321E_1$ of the first well layer 321a and a conduction band 320E of the barrier layers 320. A second barrier height $\Delta E_2$ is formed between a conduction band $321E_2$ of the second well layer 321b and a conduction band 320E of the barrier layers 320. A third barrier height $\Delta E_3$ is formed between a conduction band $321E_3$ of the third well layer 321c and a conduction band 320E of the barrier layers 320. A fourth barrier height $\Delta E_4$ is formed between a conduction band $321E_4$ of the fourth well layer 321d and a conduction band 320E of the barrier layers 320, and a fifth barrier height $\Delta E_5$ is formed between a conduction band $321E_5$ of the fifth well layer 321e and a conduction band 320E of the barrier layers 320. The first to fifth barrier heights $\Delta E_1 \sim \Delta E_5$ satisfy the following relationships: $\Delta E_1 < \Delta E_2 < \Delta E_3 < \Delta E_4 < \Delta E_5$.

Furthermore, the spectrum waveform of the broadband blue spectrum would be affected by the intensities of the sub-light beams respectively generated by the well layers 321. However, the intensities of the first to fifth sub-light beams correlate with the energy band gaps, numbers, positions of the first to fifth well layers 321a-321e and the thicknesses of the barrier layers 320 connected to the first to fifth well layers 321a-321e. The larger the energy band gap of the well layer, the smaller the barrier height (such as the first barrier height $\Delta E_1$) formed between the conduction bands of the well layer 321 and the barrier layer 320 adjacent thereto (such as the conduction band 321a of the first well layer 321a and the conduction band 320E of the barrier layer 320), and the more difficultly the electrons is trapped in the well layer 321. Accordingly, the recombination rate of electrons and holes in a well layer 321 having a larger energy band gap is relatively lower, such that the intensity of the sub-light beam generated by the well layer 321 is relatively lower. On the contrary, it is easier for electrons to be trapped in a well layer 321 having a narrower energy band gap.

Furthermore, since the mobility of the electrons is higher than that of the holes, the recombination of electrons and holes easily occurs in the well layers 321 that are closer to the P-type semiconductor layer 31. That is to say, the closer to the P-type semiconductor layer 31 the position of the well layer 321 is, the higher the intensity of the sub-light beam generated by the well layer 321. On the other hand, if the thicknesses of two barrier layers 320 that are respectively connected to each of the well layers 321, especially for one of the barrier layers 320 that is closer to the P-type semiconductor layer 31, are larger, it is easier for the electrons to be trapped in the well layer 321, so that the sub-light beam generated therefrom has a higher intensity.

Accordingly, the positions and numbers of the first to fifth well layers 321a-321e, and the thicknesses of the barrier layers 320 connected to the first to fifth well layers 321a-321e can be adjusted according to the aforementioned principles so that the spectrum waveform of the broadband blue spectrum of the light beam generated by the light-emitting stack 32 has a greater FWHM and a plurality of peak inflection points.

Specifically, in the instant embodiment, the number of the first well layer 321a (which has the largest energy band gap $Eg_1$) is greater than the number of each of the third well layer 321c, the fourth well layer 321d and the fifth well layer 321e. In addition, the number of the second well layer 321b is also greater than the number of each of the third well layer 321c, the fourth well layer 321d and the fifth well layer 321e.

For example, the light-emitting stack 32 of the instant embodiment includes four first well layers 321a, three second well layers 321b, at least one third well layer 321c, at least one fourth well layer 321d, and at least one fifth well layer 321e.

Since the fifth well layer 321e has a narrowest energy band gap $Eg_5$, compared to the first to fourth well layers 321a-321d, it is easier for electrons to be trapped in the fifth well layer 321e and then recombine with holes to generate the fifth sub-light beam. Accordingly, if the fifth well layer 321e is too close to the P-type semiconductor layer 31, it would result in too high an intensity of the fifth sub-light beam. Therefore, in the instant embodiment, the fifth well layer 321e is nearer the N-type semiconductor layer 30 and more distant from the P-type semiconductor layer 31.

Specifically, in the well layers 321 of the embodiment in the present disclosure, at least one of x number of the well layers 321 that are the closest to the N-type semiconductor layer 30 is the fifth well layer 321e, x and m each being a positive integer, and satisfying the following equation: $x \leq (m/3)$, preferably, $x \leq (m/4)$.

For example, if the light-emitting stack 32 includes eleven well layers 321 (m=11), at least one of the well layers 321 that are the first to third closest to the N-type semiconductor 30 is the fifth well layer 321e. That is to say, the fifth well layer 321e can be the well layer 321 that is the closest to, the second closest to, or the third closest to the N-type semiconductor 30.

In the embodiment shown in FIG. 3, the well layer 321 that is the second closest to the N-type semiconductor layer 30 is the fifth well layer 321e. However, in another embodiment, the fifth well layer 321e may be the well layer 321 that is the third closest to the N-type semiconductor layer 30.

On the other hand, since the first well layer 321a has a larger energy band gap $Eg_1$ than those of the second to fifth well layers 321b-321e, it is not easy for electrons to be trapped in the first well layer 321a. Accordingly, in order to increase the intensity of the first sub-light beam and increase the FWHM of the spectrum waveform of the blue spectrum of the light beam generated by the light-emitting stack 32, in the well layers 321 of the embodiment of the present disclosure, at least y number of the well layers 321 that are closest to the P-type semiconductor layer 31 are the first well layers 321a, in which y is a positive integer, and y and m satisfy the following equation: $y \geq (m/4)$.

For example, if the light-emitting stack 32 includes eleven well layers 321 (m=11), at least three (y=3) well layers 321 that are closest to the P-type semiconductor layer 31 are the first well layers 321a. In the embodiment shown in FIG. 3, four well layers 321 that are closest to the P-type semiconductor layer 31 are the first well layers 321a.

Furthermore, the well layer 321 that is the closest to the N-type semiconductor layer 30 can be one of the first to fifth well layers 321a-321e. In the embodiment shown in FIG. 3, the well layer 321 that is the closest to the N-type semiconductor layer 30 is the third well layer 321c. The well layer 321 that is the third closest to the N-type semiconductor layer 30 is the fourth well layer 321d, and the well layer that is the fourth closest to the N-type semiconductor layer 30 is another third well layer 321c. In other words, for these two third well layers 321c, one of the third well layers 321c is closest to the N-type semiconductor layer 30, and the other one of the third well layers 321c is located at a position closer to the P-type semiconductor layer 31 than that of the fourth well layer 321d. Furthermore, other three well layers 321, which are located between the well layer 321 that is the fourth closest to the N-type semiconductor layer 30 and the well layer 321 that is the fourth closest to the P-type semiconductor layer 31, are the second well layers 321b.

Reference is made to FIG. 3. Each of the barrier layers 320 has a thickness larger than that of any one of the well layers 321. Furthermore, the thicknesses of the well layers 321 and the barrier layers 320 would affect the spectrum waveform of the broadband blue spectrum.

It should be noted that the thickness of the conventional barrier layer is about 2 to 3.5 times of that of the well layer. Specifically, the thickness of the conventional barrier layer ranges from 8.5 nm to 10.5 nm. However, a spectrum waveform generated by a light-emitting diode may be easily distorted due to a variation of the operating current applied to the light-emitting diode.

Accordingly, in the embodiment of the present disclosure, a ratio of the thickness of the barrier layer 320 to the thickness of the well layer 321 ranges from 2.5 to 5, preferably from 3 to 4. Therefore, compared to the conventional technique, the negative effect on the spectrum waveform resulted from the variation of the operating current can be attenuated in the present disclosure. Preferably, the thickness of the barrier layer 320 ranges from 8.5 nm to 15 nm, preferably from 9.5 nm to 15 nm. In addition, the thickness of the well layer 321 ranges from 2.5 nm to 4.5 nm.

In the embodiment shown in FIG. 3, the barrier layers 320 at least includes a plurality of first barrier layers 320a and a plurality of second barrier layers 320b. Each of the first barrier layers 320a has a thickness smaller than that of each of the second barrier layers 320b. In one embodiment, the thickness of the second barrier layer 320b is 1 to 1.5 times of the thickness of the first barrier layer 320a.

Furthermore, in the instant embodiment, two barrier layers 320 that are connected to two opposite sides of the fifth well layer 321e are the second barrier layers 320b, and the other barrier layers 320 are the first barrier layers 320a. That is to say, the (second) barrier layers 320 that are directly connected to the fifth well layer 321e each have a greater thickness. As such, the recombination rate of electrons and holes in the fifth well layer 321e can be improved, thereby increasing the intensity of the fifth sub-light beam.

Figure 4:
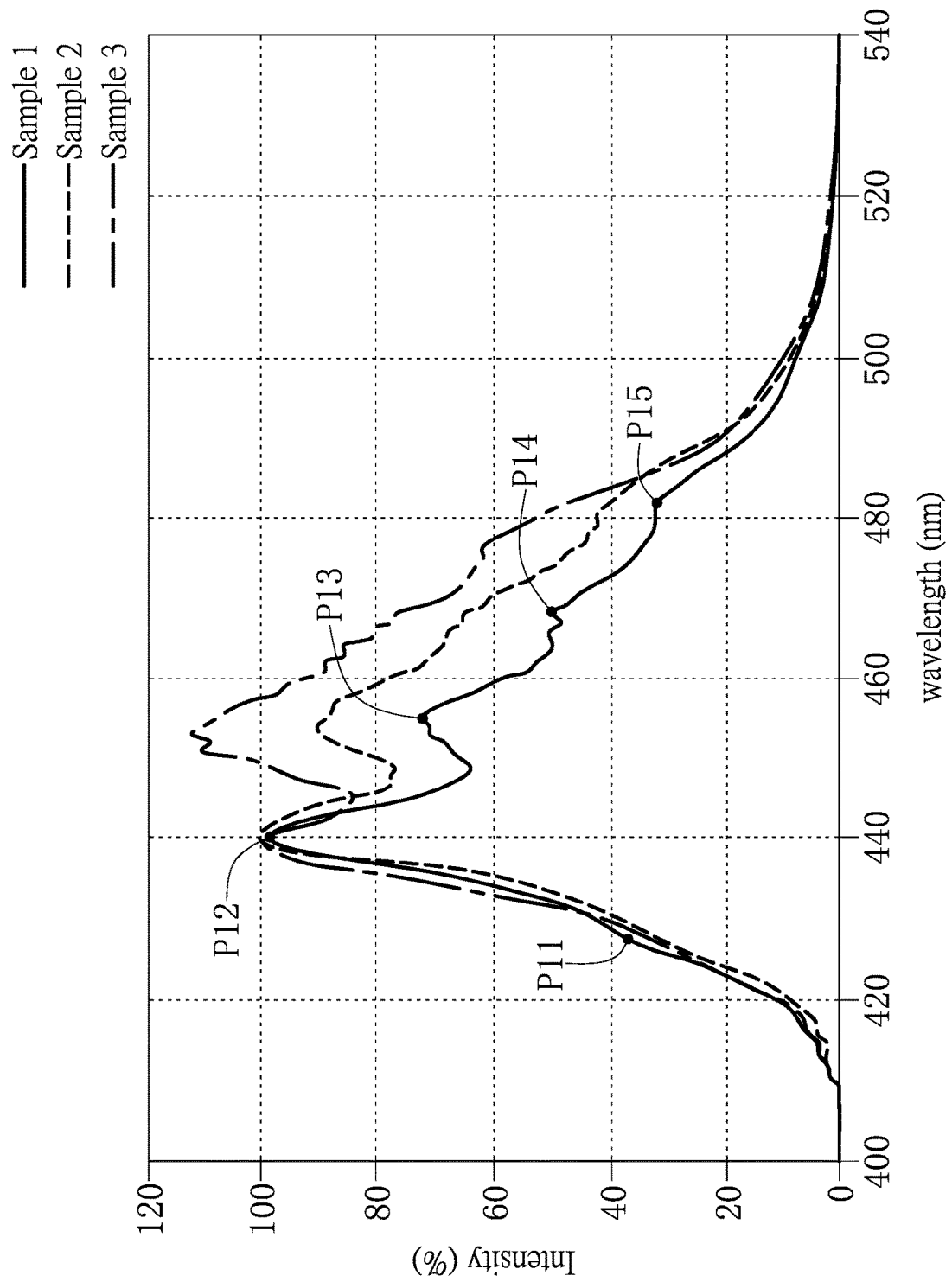
FIG. 4 is a broadband blue spectrum of the light-emitting diode according to the first embodiment of the present disclosure.

Reference is made to FIG. 4, which is a broadband blue spectrum of the light-emitting diode according to the first embodiment of the present disclosure. It should be noted that the light-emitting diodes respectively in Samples 1-3 are the light-emitting diode Z12 of the first embodiment. However, even though these light-emitting diodes are fabricated under the same conditions and by the same equipment, the thicknesses of the well layer 321 and the barrier layer 302 in each of Samples 1~3 may deviate from a predetermined thickness due to the limitations of the fabrication conditions or equipment. Although the thickness deviation falls within a tolerance, the spectrum waveforms of the broadband blue spectrums generated by the light-emitting diodes of the Samples 1~3 may be different. However, all the spectrum waveforms generated by the light-emitting diodes of the Samples 1~3 can still satisfy the requirements of the products in the present disclosure.

As shown in FIG. 4, the spectrum waveforms of the broadband blue spectrums generated by the Samples 1~3 each have a plurality of peak inflection points, and the peak inflection points each correspond to a wavelength value and an intensity. Since the spectrum waveforms of the broadband blue spectrums shown in FIG. 4 are generated by the same kind of the light-emitting diodes in the Samples 1~3, in the following descriptions, the spectrum waveform of the broadband blue spectrum generated by the Sample 1 is exemplified. As shown in FIG. 4, the spectrum waveform of the broadband blue spectrum generated by the Sample 1 has first to fifth peak inflection points P11~P15 which respectively correspond to first to fifth wavelength values and first to fifth intensities.

It should be noted that a difference between two wavelength values (such as the first and second wavelength values, the second and third wavelength values, the third and fourth wavelength values, or the fourth and fifth wavelength values) to which any two adjacent ones of the peak inflection points (such as the first and second peak inflection points P11, P12, the second and third peak inflection points P12, P13, the third and fourth peak inflection points P13, P14, or the fourth and fifth peak inflection points P14, P15) respectively correspond is less than or equal to 18 nm.

According to experiment results, by providing a light beam with a spectrum waveform, in which the difference between the two wavelength values to which any two adjacent ones of the peak inflection points respectively correspond is less than or equal to 18 nm, the stability of the spectrum waveform of the broadband blue spectrum can be improved under a situation where the operating current is changed. That is to say, when the operating current applied to the light-emitting diode Z12 is changed, the spectrum waveform of the broadband blue spectrum generated by the light-emitting diode Z12 varies within a specific range. In one exemplary embodiment, the difference between two wavelength values to which any two adjacent ones of the peak inflection points respectively correspond is less than or equal to 15 nm.

Since the spectrum waveform of the broadband blue spectrum of the light beam generated by the light-emitting stack 32 is formed by superimposing the first to fifth sub-light beams, in the spectrum waveform of the broadband blue spectrum, it is not necessary for the first wavelength value to be the same as the first wavelength of the first sub-light beam. However, the first wavelength value and the first wavelength jointly correspond to the same wavelength range, which is less than or equal to 435 nm. Similarly, the second wavelength value and the second wavelength of the second sub-light beam may be different but correspond to the same wavelength range from 430 nm to 450 nm. The third wavelength value and the third wavelength of the third sub-light beam may be different but correspond to the same wavelength range from 442 nm to 465 nm. The fourth wavelength value and the fourth wavelength of the fourth sub-light beam may be different but correspond to the same wavelength range from 455 nm to 475 nm. The fifth wavelength value and the fourth wavelength of the fourth sub-light beam may be different but correspond to the same wavelength range that is larger than or equal to 470 nm.

Accordingly, by controlling the energy band gaps of the first to fifth well layers 321a-321e in the light-emitting stack 32, the difference between two wavelength values to which any two adjacent ones of the peak inflection points correspond in the spectrum waveform of the broadband blue spectrum can be adjusted.

Reference is made to FIG. 4. It can be observed that in the spectrum waveforms of the spectrums generated from the Samples 1~3, the first intensity of the first peak inflection point P11 and the third to fifth intensities of the third to fifth peak inflection points P13~P15 may increase or decrease relative to the second intensity of the second peak inflection point P12.

If the second intensity of the second peak inflection point is defined as 100%, the first intensity may range from 20% to 80%, the third intensity may range from 40% to 140%, the fourth intensity may range from 20% to 120%, and the fifth intensity may range from 10% to 80%. That is to say, a ratio of the first intensity to the second intensity ranges from 0.2 to 0.8, a ratio of the third intensity to the second intensity ranges from 0.4 to 1.4, a ratio of the fourth intensity to the second intensity ranges from 0.2 to 1.2, and a ratio of the fifth intensity to the second intensity ranges from 0.1 to 0.8.

However, the aforementioned description for the light-emitting diode of the first embodiment is merely an example and is not meant to limit the scope of the present disclosure.

Figure 5:
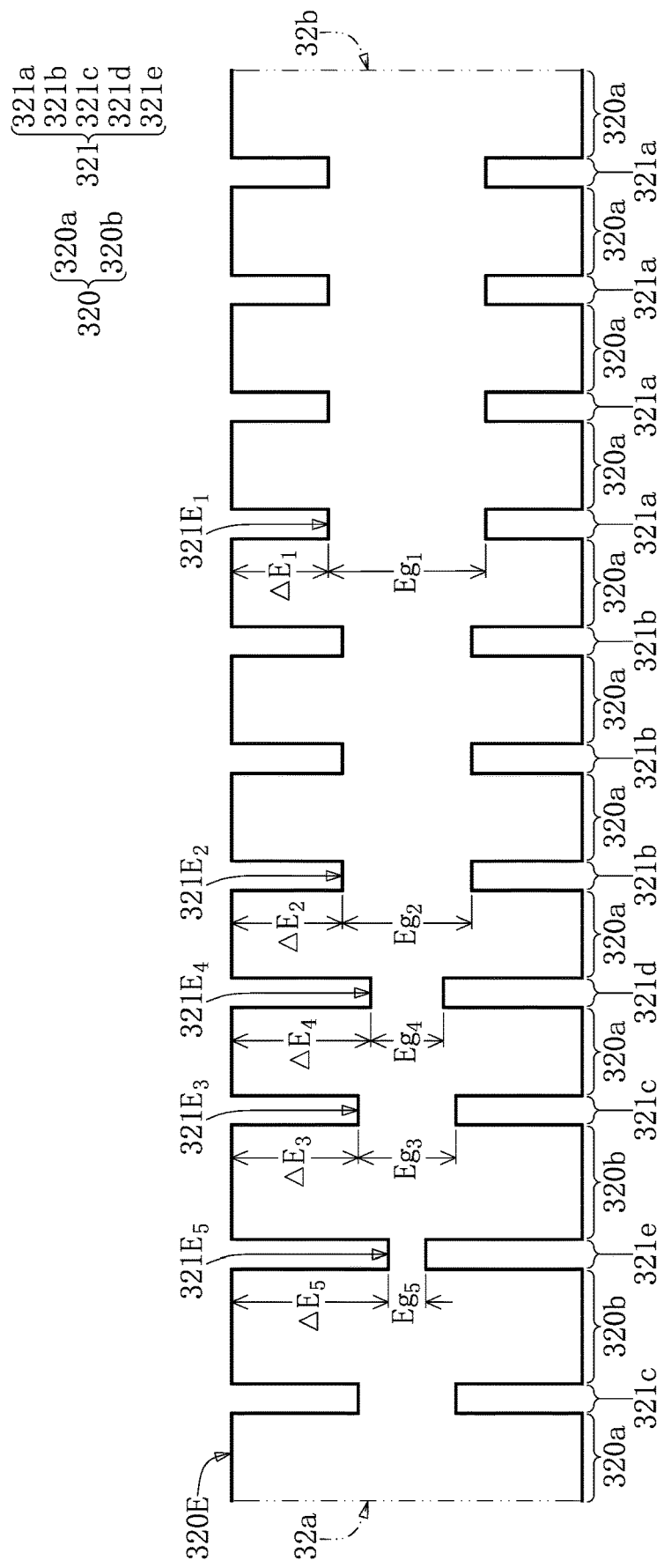
FIG. 5 is a schematic energy band diagram of the light-emitting stack according to a second embodiment of the present disclosure.

Reference is made to FIG. 5, which is a schematic energy band diagram of the light-emitting stack according to a second embodiment of the present disclosure. The light-emitting stack provided in the instant embodiment can also generate a light beam with the broadband blue spectrum, in which a FWHM of a spectrum waveform is not less than 30 nm and the spectrum waveform may have a plurality of peak inflection points. Furthermore, a difference between two wavelength values to which any two adjacent ones of the peak inflection points correspond is less than or equal to 18 nm.

The components in the instant embodiment that are the same as those in the first embodiment are given the same reference numerals and will not be reiterated herein. In the light-emitting stack of the instant embodiment, the position of the fourth well layer 321$d$ is closer to the P-type semiconductor layer 31 (the second side 32$b$) than that of one of the third well layers 321$c$.

Specifically, in the second embodiment, the well layer 321 that is the third closest to the N-type semiconductor layer 30 (the first side 32$a$) is the third well layer 321$c$, and the well layer 321 that is the fourth closest to the N-type semiconductor layer 30 (the first side 32$a$) is the fourth well layer 321$d$. Since the position of the fourth well layer 321$d$ is closer to the P-type semiconductor layer 31 (the second side 32$b$) than that in the first embodiment, the intensity of the fourth sub-light beam would become higher.

Accordingly, in order to prevent the intensity of the fourth sub-light beam from being too high, the barrier layers 320 that are connected to the fourth well layer 321$d$ cannot be too thick. That is to say, at least one of the barrier layers 320 that are respectively connected to two opposite sides of the fourth well layer 321$d$ is the first barrier layer 320$a$. To be more specific, the barrier layer 320 that is connected to the fourth well layer 321$d$ and closer to the N-type semiconductor layer 30 (first side 32$a$), i.e., the barrier layer 320 located between the third and fourth well layers 321$c$, 321$d$, is the first barrier layer 320$a$ with a smaller thickness. In the instant embodiment, both the two barrier layers 320 that are respectively connected to two opposite sides of the fourth well layer 321$d$ are the first barrier layers 320$a$.

However, it is not necessary for the two barrier layers 320 that are connected to two opposite sides of the fourth well layer 321$d$ to have the same thickness. In one embodiment, one of the barrier layers 320 that is connected to the fourth well layer 321$d$ and closer to the N-type semiconductor layer 30 (first side 32$a$) has a thickness less than that of the other one of the barrier layers 320 that is closer to the P-type semiconductor layer 31 (the second side 32$b$).

Figure 6:
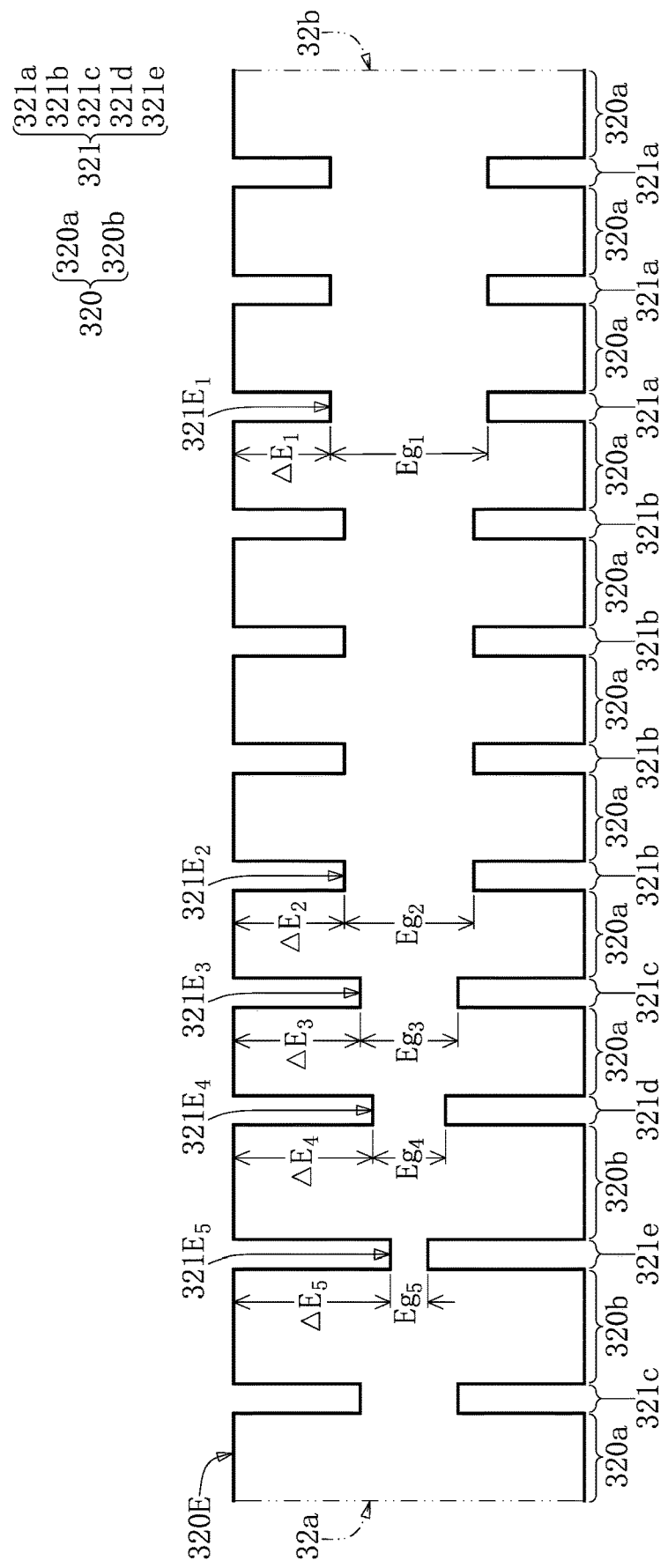
FIG. 6 is a schematic energy band diagram of the light-emitting stack according to a third embodiment of the present disclosure.

Reference is made to FIG. 6, which is a schematic energy band diagram of the light-emitting stack according to a third embodiment of the present disclosure. The light-emitting stack provided in the instant embodiment can also generate a light beam with the broadband blue spectrum, in which a FWHM of a spectrum waveform is not less than 30 nm and the spectrum waveform may have at least three peak inflection points. Furthermore, a difference between two wavelength values to which any two adjacent ones of the peak inflection points correspond is less than or equal to 18 nm.

The components in the instant embodiment that are the same as those in the first embodiment are given the same reference numerals and will not be reiterated herein. In the light-emitting stack of the third embodiment, the number of the second well layers 321$b$ is greater than that of the first well layers 321$a$.

Specifically, in the well layers 321 of the instant embodiment, at least y number of the well layers 321 that are closest to the P-type semiconductor layer 31 are the first well layers 321$a$, in which y is a positive integer, and y and m satisfy the following equation: y≥(m/4).

For example, if the light-emitting stack 32 includes eleven well layers 321 (m=11), at least three (y=3) well layers 321 that are closest to the P-type semiconductor layer 31 are the first well layers 321$a$. Furthermore, all of the well layers 321, which are located between the well layer 321 that is the fourth closest to the N-type semiconductor layer 30 and the well layer 321 that is the third closest to the P-type semiconductor layer 31, are the second well layers 321$b$. Accordingly, in the instant embodiment, the light-emitting stack 32 includes three first well layers 321$a$ and four second well layers 321$b$.

Figure 7:
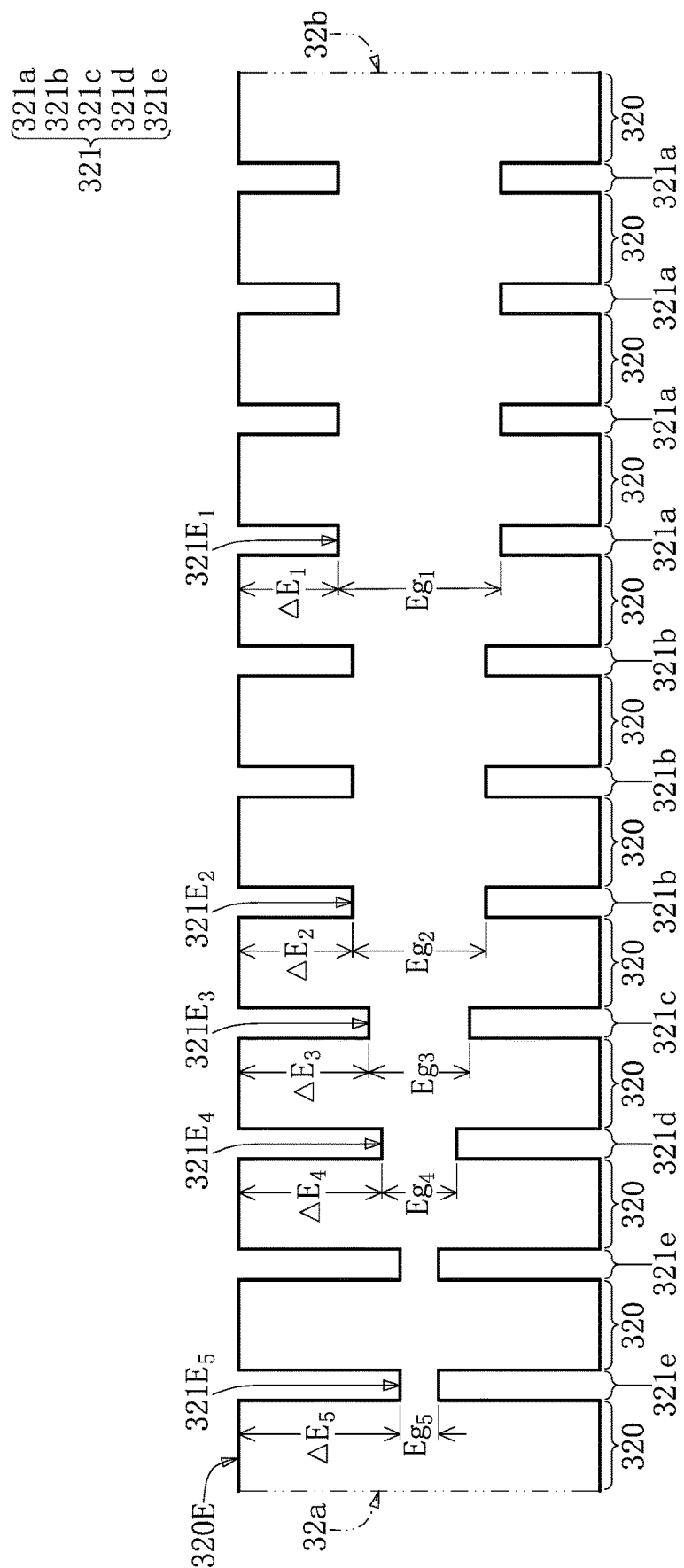
FIG. 7 is a schematic energy band diagram of the light-emitting stack according to a fourth embodiment of the present disclosure.

Reference is made to FIG. 7, which is a schematic energy band diagram of the light-emitting stack according to a fourth embodiment of the present disclosure. The light-emitting stack provided in the instant embodiment can also generate a light beam with the broadband blue spectrum, in which a FWHM of a spectrum waveform is not less than 30 nm and the spectrum waveform may have at least three peak inflection points. Furthermore, a difference between two wavelength values to which any two adjacent ones of the peak inflection points correspond is less than or equal to 18 nm.

The components in the instant embodiment that are the same as those in the first embodiment are given the same reference numerals and will not be reiterated herein. In the light-emitting stack of the instant embodiment, x number of the well layers 321 that are the closest to the N-type semiconductor layer 30 includes two fifth well layers 321$e$, x, and m each being a positive integer, and satisfying the following equation: x≤(m/3), preferably, x≤(m/4).

For example, if the light-emitting stack 32 includes eleven well layers 321 (m=11), two of the well layers 321 that are the first to third closest to the N-type semiconductor 30 are the fifth well layers 321$e$. In the instant embodiment, the well layers 321 that are the closest to and the second closest to the N-type semiconductor 30 are both the fifth well layers 321$e$.

Since the x number of the well layers 321 that are the closest to the N-type semiconductor 30 (first side 32$a$) includes two fifth well layers 321$e$, the intensity of the fifth sub-light beam would be increased. In the instant embodiment, in order to prevent the spectrum waveform of the broadband blue spectrum from being distorted due to higher intensity of the fifth sub-light beam, it is not necessary for the barrier layer 320 interposed between the two fifth well layers 321$e$ to have the thickness thereof increased. That is to say, the barrier layers 320 can have the same thickness in the instant embodiment. In one preferred embodiment, the barrier layers 320 that are connected to each of the two fifth well layers 321$e$ each have a thickness (T1) that is about 0.5 to 1 times of the thickness (T2) of any one of the other barrier layers 320 that may be connected to the first, second, third, or fourth well layer 321$a$-321$d$. That is to say, T1 and T2 satisfy the following relationship: T1≈(0.5~1)×T2.

Figure 8:
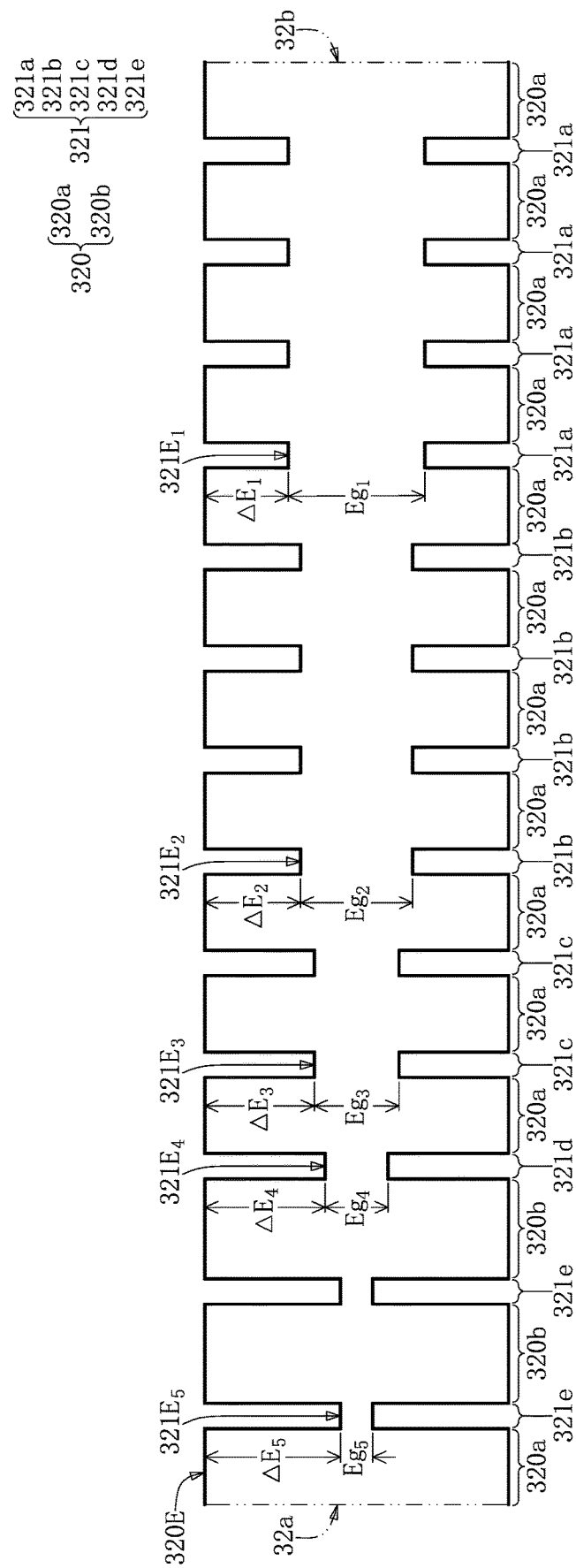
FIG. 8 is a schematic energy band diagram of the light-emitting stack according to a fifth embodiment of the present disclosure.

Reference is made to FIG. 8, which is a schematic energy band diagram of the light-emitting stack according to a fifth embodiment of the present disclosure. The light-emitting stack provided in the instant embodiment can also generate a light beam with the broadband blue spectrum. The components in the instant embodiment that are the same as those in the fourth embodiment are given the same reference numerals and will not be reiterated herein.

In the light-emitting stack of the instant embodiment, two well layers 321 that is the closest to the N-type semiconductor layer 30 are the fifth well layers 321e, and two barrier layer 320 that are connected to the fifth well layers 321e are the second barrier layers 320b each having a larger thickness. Furthermore, the barrier layers 320 that are connected to the first to fourth well layers 321a-321d can be the first barrier layers 320a each having a smaller thickness.

However, in the instant embodiment, the spectrum waveform of the broadband blue spectrum of the light beam generated by the light-emitting stack can be modified by increasing the number of the quantum wells. Specifically, the light-emitting stack 32 of the instant embodiment includes thirteen well layers 321 (m=13). Furthermore, two well layers 321 that are closest to the N-type semiconductor layer 30 are the fifth well layers 321e.

In order to prevent the spectrum waveform of the broadband blue spectrum from being distorted due to higher intensity of the fifth sub-light beam, the numbers of the second and third well layers 321b, 321c are both increased in the instant embodiment. Specifically, compared to the fourth embodiment, the light-emitting stack 32 includes four second well layers 321b and two third well layers 321c.

Figure 9:
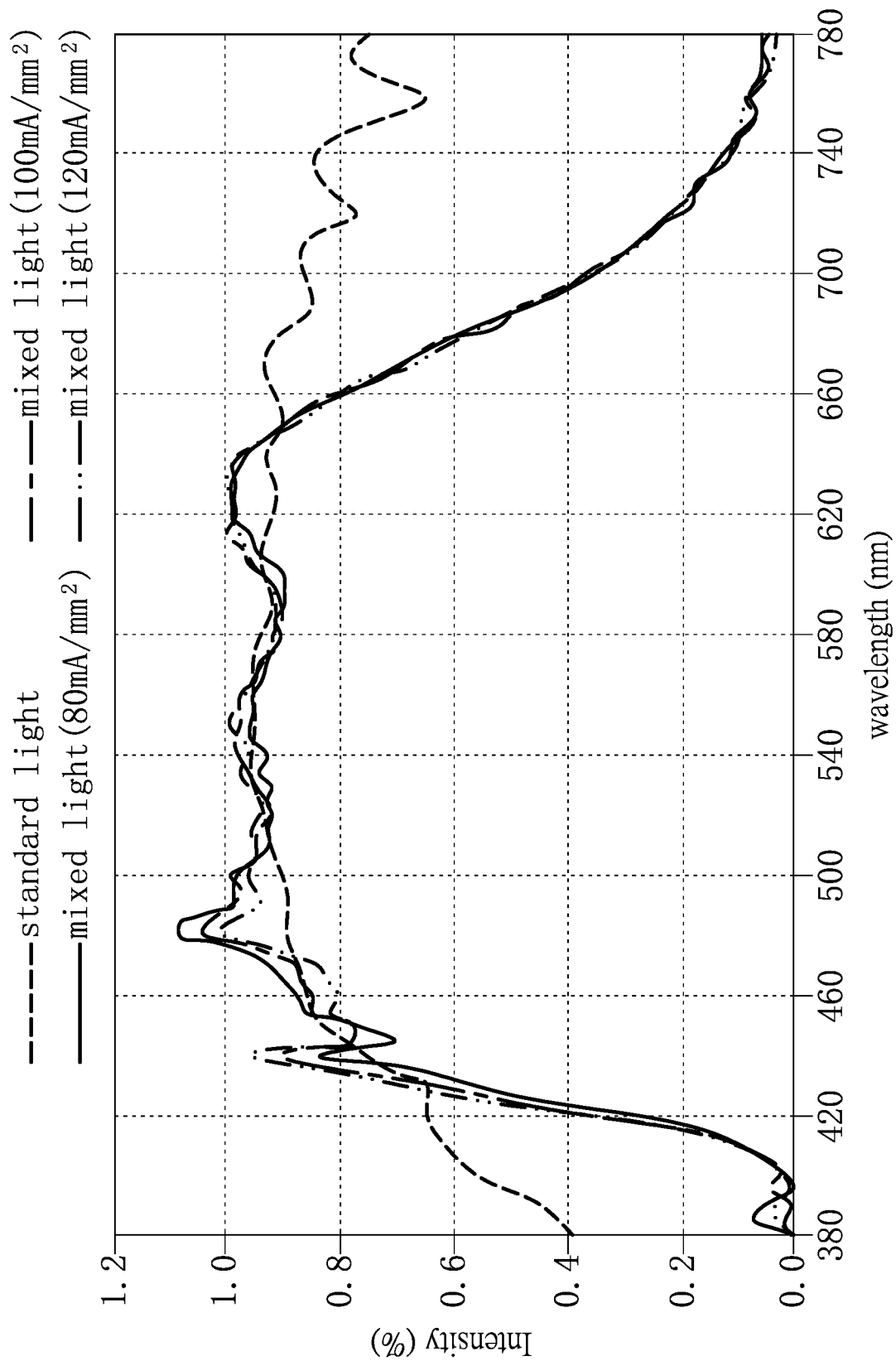
FIG. 9 shows spectrums of standard light and mixed light generated by the light-emitting module and obtained under different operating current densities according to an embodiment of the present disclosure.
Figure 10:
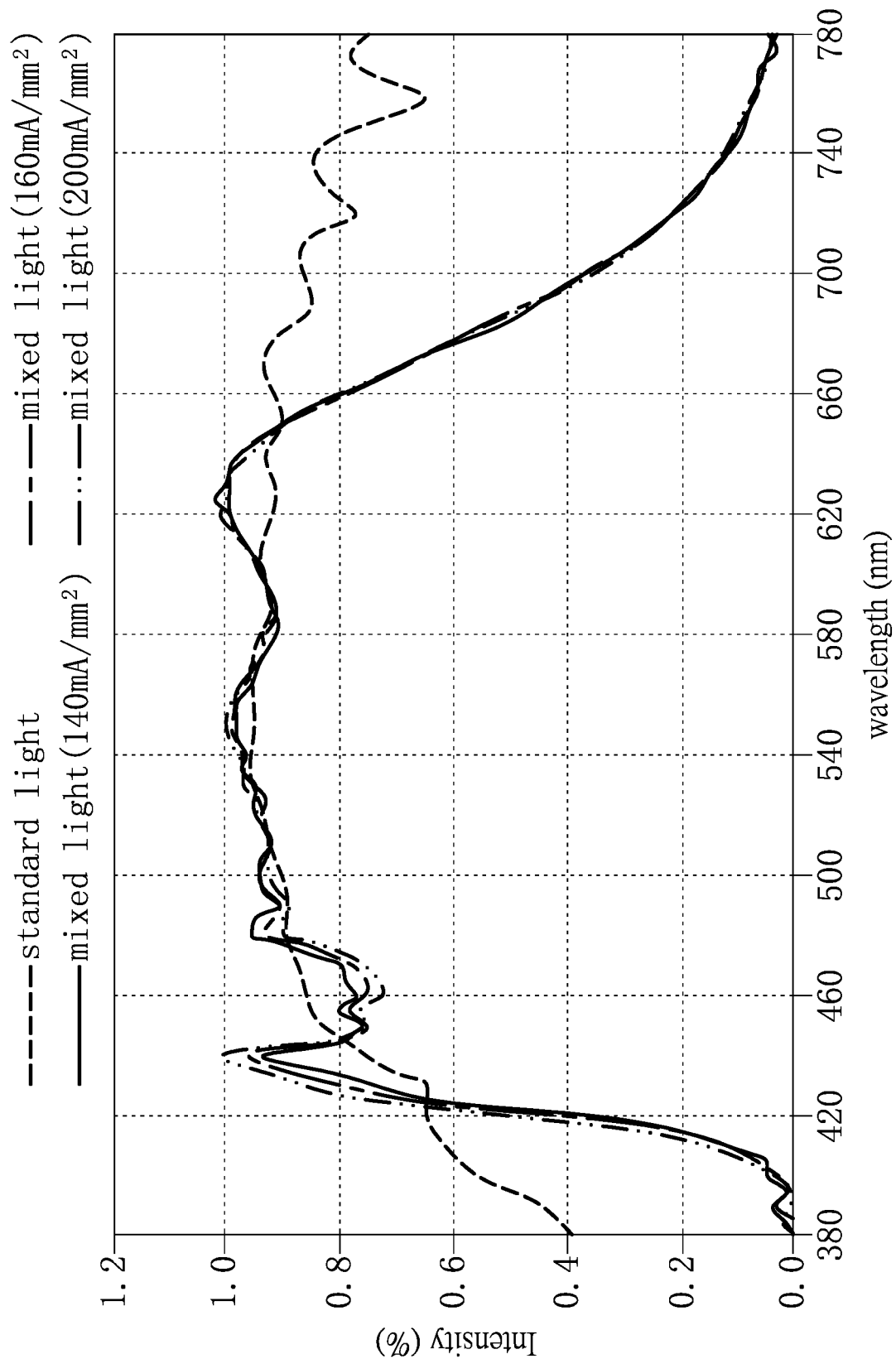
FIG. 10 shows spectrums of standard light and mixed light generated by the light-emitting module and obtained under different operating current densities according to an embodiment of the present disclosure.

Reference is made to FIG. 9 and FIG. 10. FIG. 9 shows spectrums of standard light and mixed light generated by the light-emitting module and obtained under different operating current densities according to an embodiment of the present disclosure, and FIG. 10 shows spectrums of standard light and mixed light generated by the light-emitting module and obtained under different operating current densities according to an embodiment of the present disclosure. It should be noted that the mixed light generated by the light-emitting module in an embodiment of the present disclose has a color temperature greater than or equal to 5000K. Accordingly, the standard light is a simulated natural daylight (D50) with a color temperature of 5000K.

As shown in FIG. 1, the light beam generated by the light-emitting diode Z12 passes through the wavelength conversion layer Z13 to produce a mixed light with a white light spectrum. FIG. 9 shows the white light spectrums that are measured respectively under different operating current densities of 80 mA/mm², 100 mA/mm², and 120 mA/mm². FIG. 10 shows the white light spectrums that are measured respectively under different operating current densities of 140 mA/mm², 160 mA/mm², and 200 mA/mm². Furthermore, in the present embodiment, the chip size of the light-emitting diode used in the light-emitting module is 26×30 mil².

As shown in FIG. 9 and FIG. 10, even though the light-emitting diode is operated under different operating current densities (ranging from 80 mA/mm² to 200 mA/mm²), the spectrum waveforms of the white light spectrums generated by the light-emitting module Z1 of the instant embodiment substantially conform with a spectrum waveform of the standard light at the blue light wavelength band (from 440 nm to 500 nm), and are not severely distorted under different operating current densities.

Figure 11:
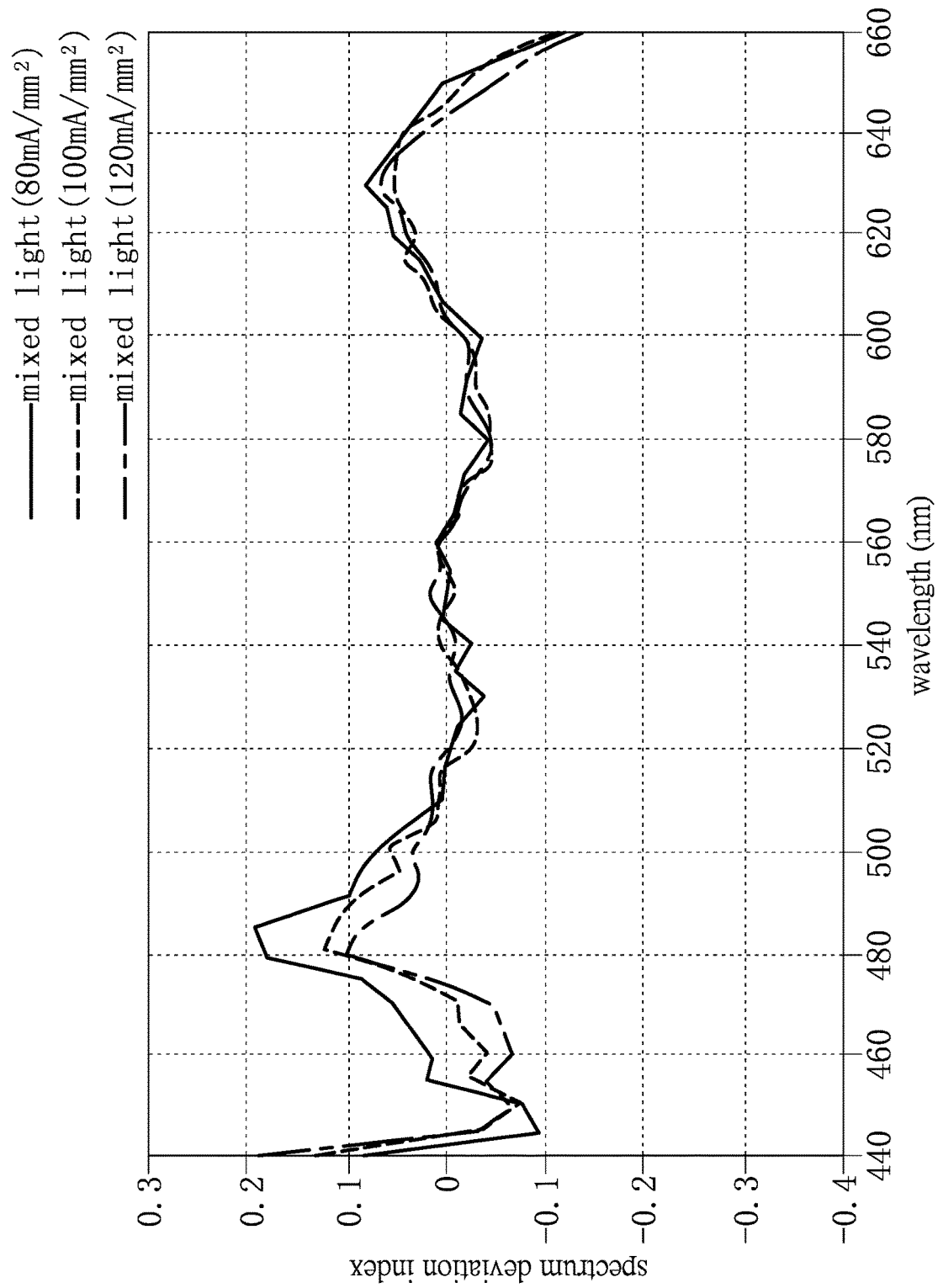
FIG. 11 shows spectrum deviation indices of mixed light measured under different operating current densities of the light-emitting module according to an embodiment of the present disclosure.
Figure 12:
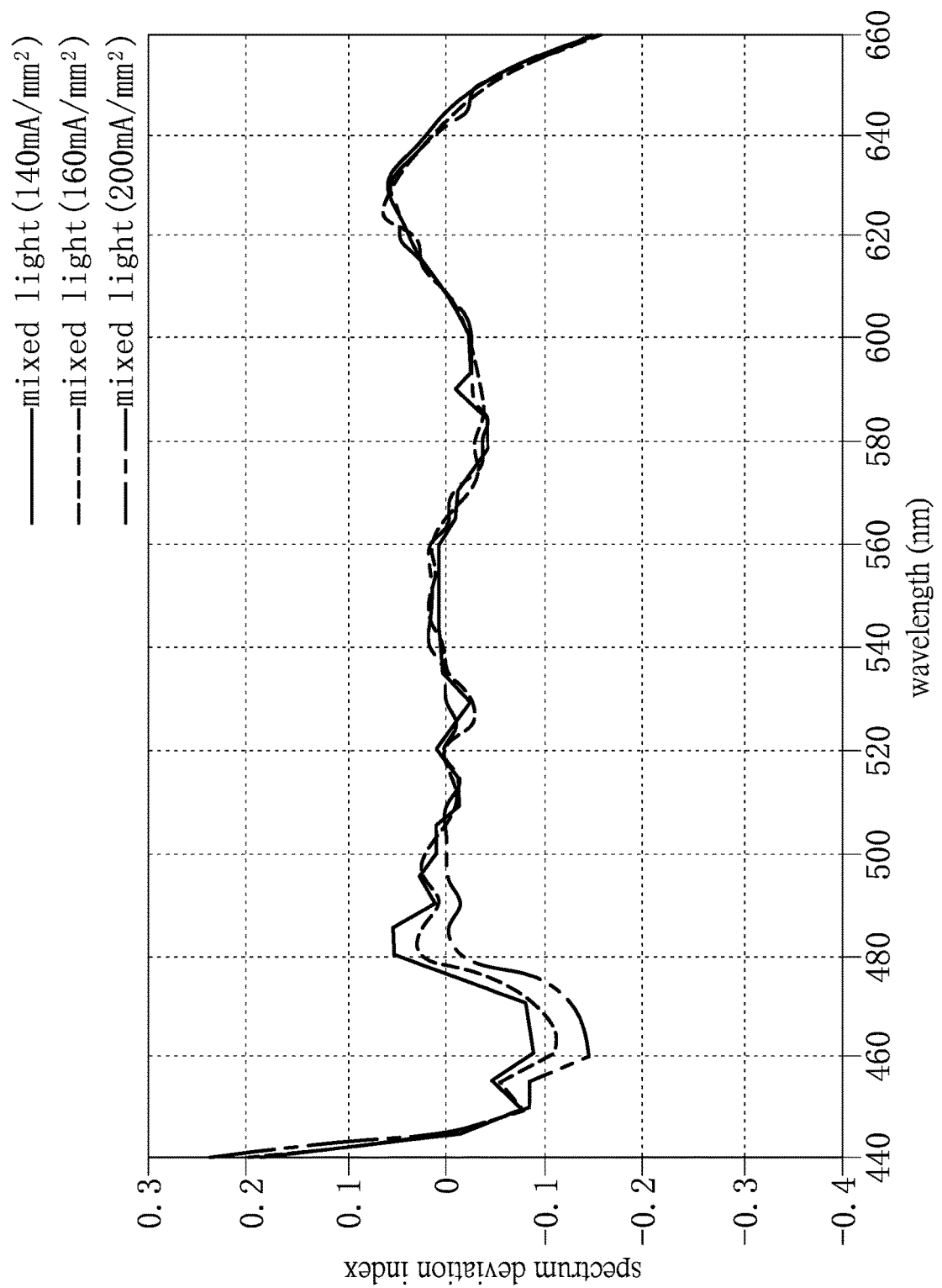
FIG. 12 shows spectrum deviation indices of mixed light obtained by applying different operating current densities to the light-emitting module according to an embodiment of the present disclosure.

Reference is made to FIG. 11 and FIG. 12, which show spectrum deviation indices of mixed light measured under different operating current densities of the light-emitting module according to an embodiment of the present disclosure. The aforementioned spectrum deviation index can be obtained by calculating a difference between a reference intensity ($I_s$) of the spectrum of the standard light and an intensity ($I_x$) of the white light spectrum of the mixed light which correspond to the same wavelength ($\lambda_x$), and then dividing the difference by the reference intensity ($I_s$) of the spectrum of the standard light at the same wavelength. That is to say, for a certain wavelength ($\lambda_x$), a spectrum deviation index ($C_x$), the intensity ($I_x$) of the white light spectrum of the mixed light, the reference intensity ($I_s$) of the spectrum of the standard light, satisfy the following equation: $C_x=(I_x-I_s)/I_s$. FIG. 11 shows the spectrum deviation indices of mixed light measured under different operating current densities of 80 mA/mm², 100 mA/mm², and 120 mA/mm², at different wavelengths, and FIG. 12 shows spectrum deviation indices of mixed light measured under different operating current densities of 140 mA/mm², 160 mA/mm², and 200 mA/mm², at different wavelengths.

It should be noted that the white light spectrums that are measured under different operating current densities falling within a range from 80 mA/mm² to 200 mA/mm² are each normalized relative to the standard light by setting Y (one of the tristimulus values of CIE XYZ color space) as being equal to 100. After the white light spectrums are normalized, the spectrum deviation indices, which respectively correspond to different wavelengths, of each of the white light spectrums are calculated relative to the spectrum of the standard light.

Reference is made to FIG. 11. When the operating current density is 80 mA/mm², each of the spectrum deviation indices of the white light spectrum varies in a range from −0.1 to 0.2 within a wavelength range of 450 nm to 500 nm relative to a spectrum of the standard light. Reference is made to FIG. 12. When the operating current density is 200 mA/mm², each of the spectrum deviation indices of the white light spectrum varies in a range from −0.15 to 0.3 within a wavelength range of 450 nm to 500 nm relative to a spectrum of the standard light.

Furthermore, any one of spectrum deviation indices of the (normalized) white light spectrums corresponding to a wavelength ranging from 450 nm to 500 nm, which are measured under different operating current densities of the light-emitting diode falling within a range from 80 mA/mm² to 200 mA/mm², has a variation smaller than or equal to 0.3. For example, for two of the (normalized) white light spectrums that are respectively measured under different operating current densities of 80 mA/mm² and 200 mA/mm², the spectrum deviation indices ($C_{80x}$ and $C_{200x}$) of the two white light spectrums corresponding to any one (2) of wavelengths ranging from 450 nm to 500 nm have a difference less than or equal to 0.3.

Figure 13:
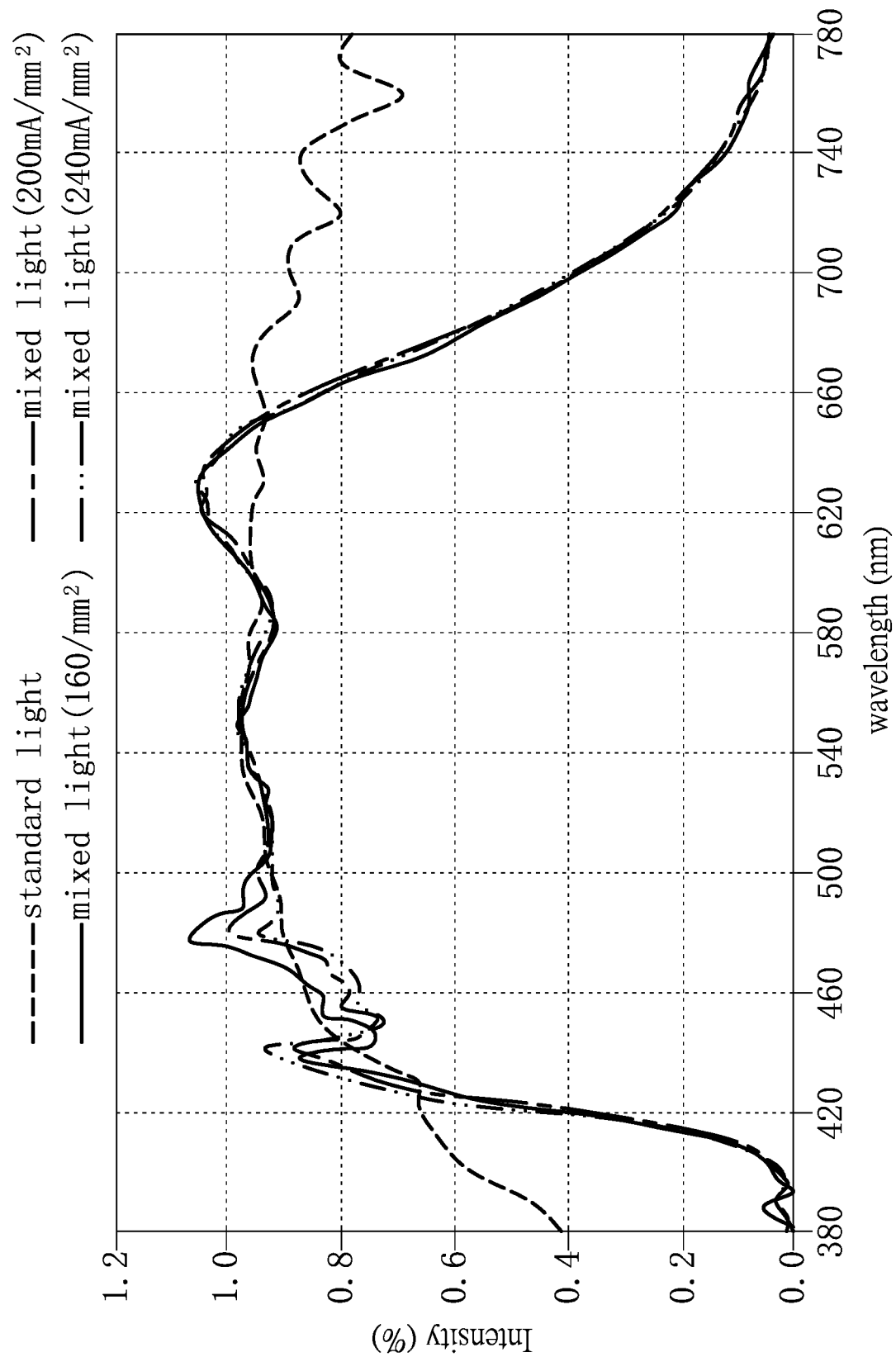
FIG. 13 shows spectrums of standard light and mixed light generated by the light-emitting module and measured under different operating current densities according to an embodiment of the present disclosure.
Figure 14:
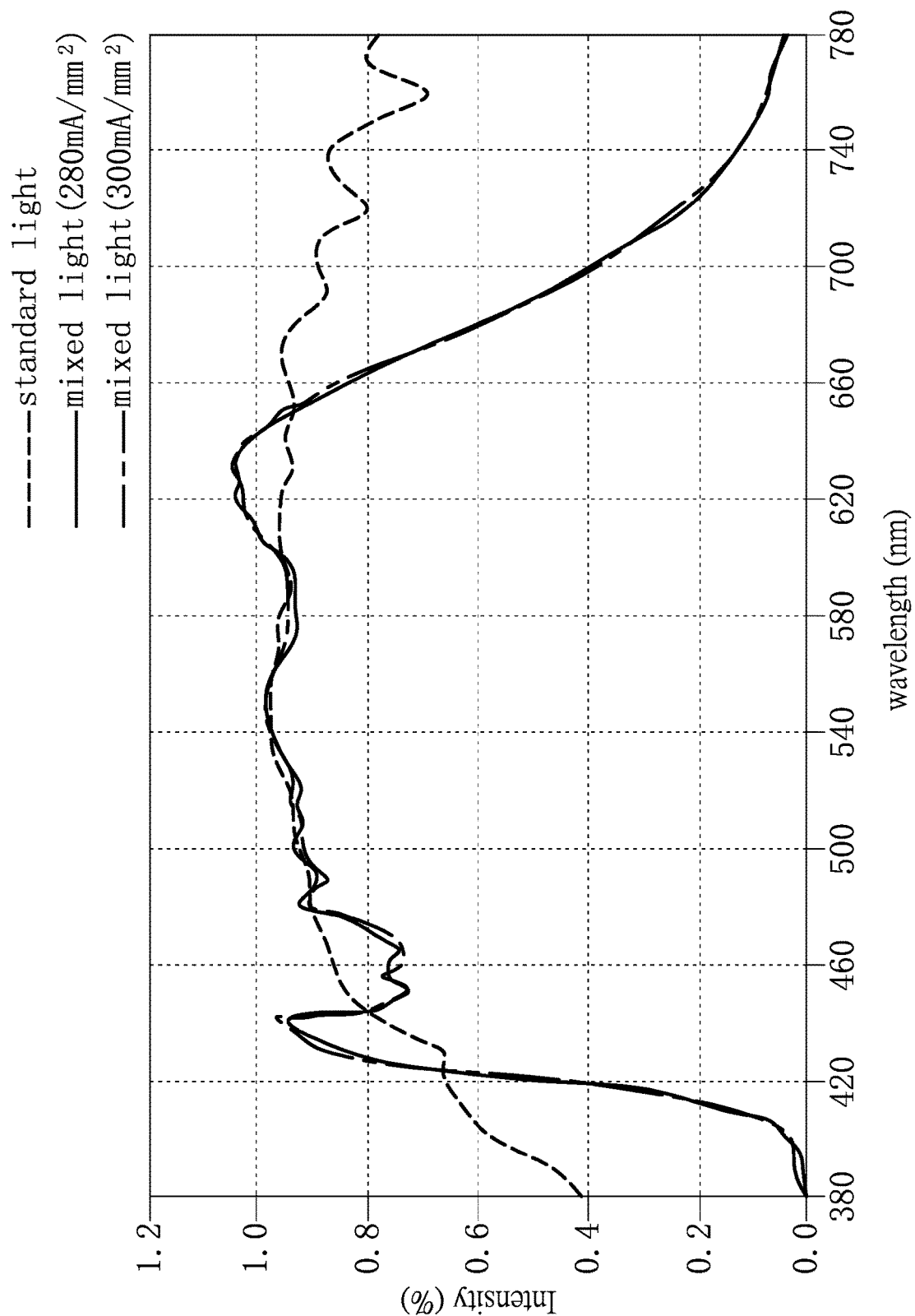
FIG. 14 shows spectrums of standard light and mixed light generated by the light-emitting module and measured under different operating current densities according to an embodiment of the present disclosure.

Reference is made to FIG. 13 and FIG. 14, which show spectrums of standard light and mixed light generated by the light-emitting module and measured under different operating current densities according to an embodiment of the present disclosure. FIG. 13 shows white light spectrums measured under different operating current densities of 160 mA/mm², 200 mA/mm², and 240 mA/mm². FIG. 14 shows white light spectrums that are measured respectively under different operating current densities of 280 mA/mm² and 300 mA/mm². Furthermore, in the present embodiment, the chip size of the light-emitting diode used in the light-emitting module is 26×30 mil².

As shown in FIG. 13 and FIG. 14, even though the light-emitting diode is operated under different operating current densities (ranging from 160 mA/mm² to 300 mA/mm²), the spectrum waveforms of the white light spectrums generated by the light-emitting module Z1 of the instant embodiment substantially conform with a spectrum waveform of the standard light at the blue light wavelength band (from 440 nm to 500 nm), and are not severely distorted under the operating current density.

Figure 15:
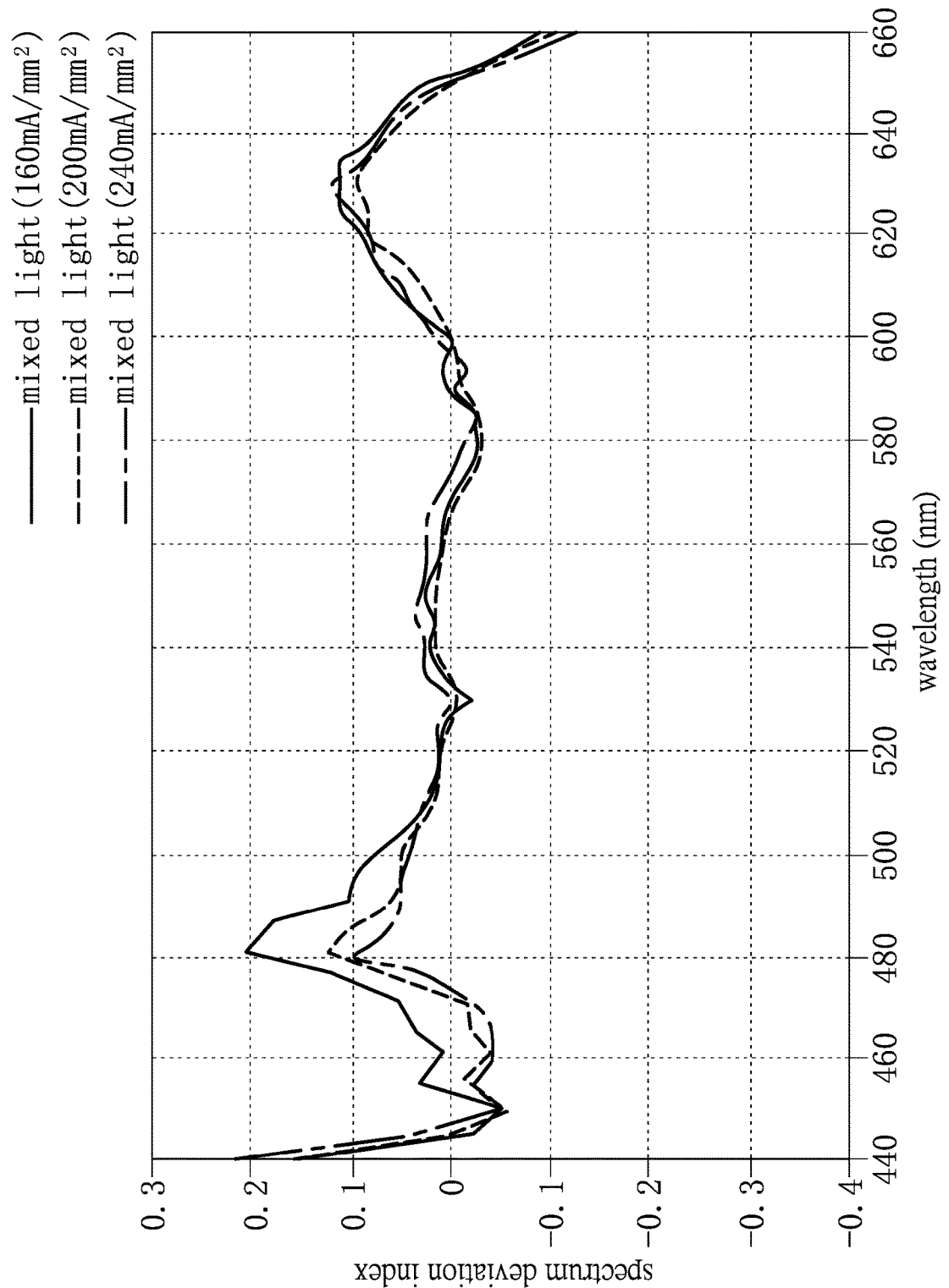
FIG. 15 shows spectrum deviation indices of mixed light obtained by applying different operating current densities to the light-emitting module according to an embodiment of the present disclosure.
Figure 16:
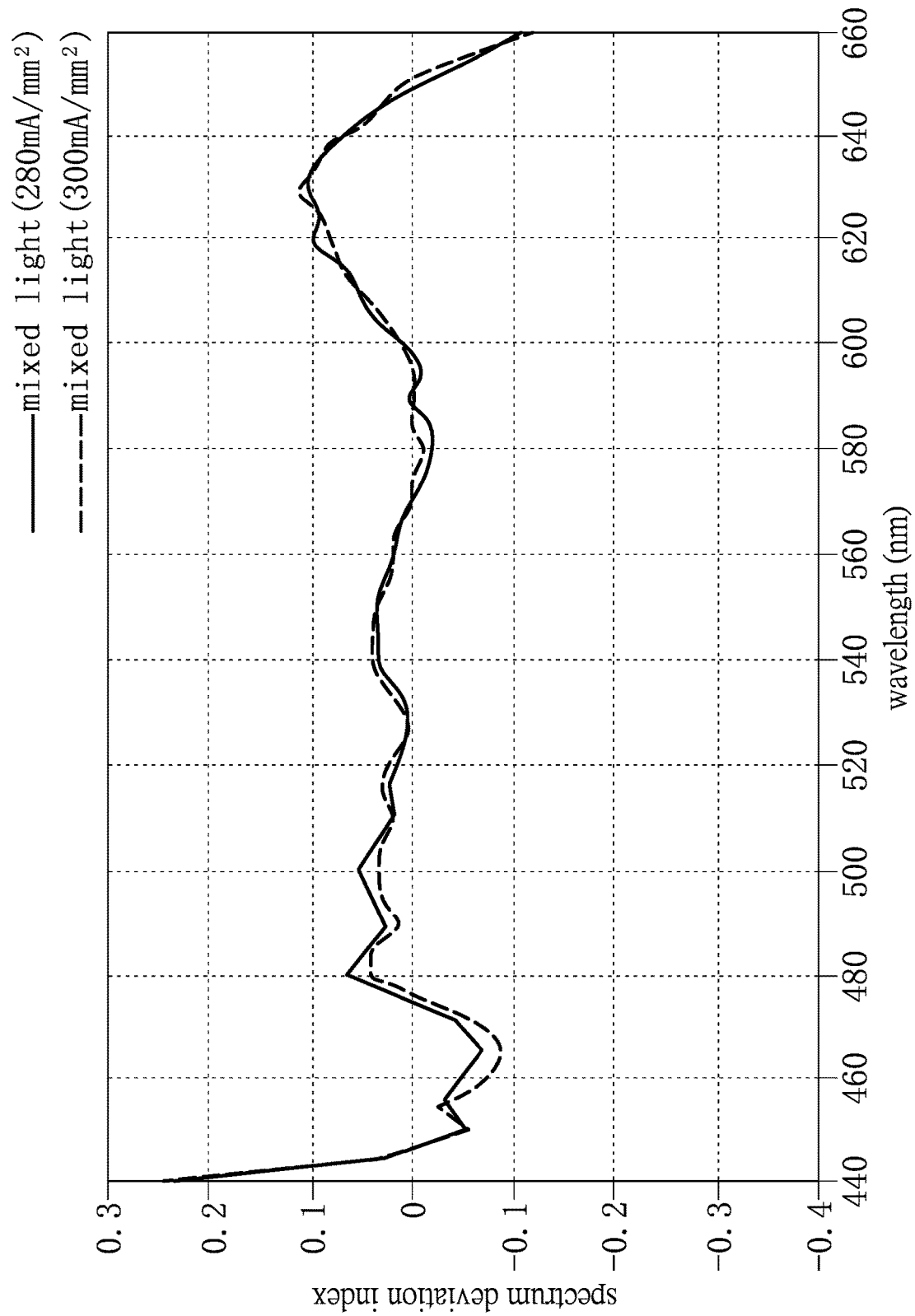
FIG. 16 shows spectrum deviation indices of mixed light obtained by applying different operating current densities to the light-emitting module according to an embodiment of the present disclosure.
Figure 17:
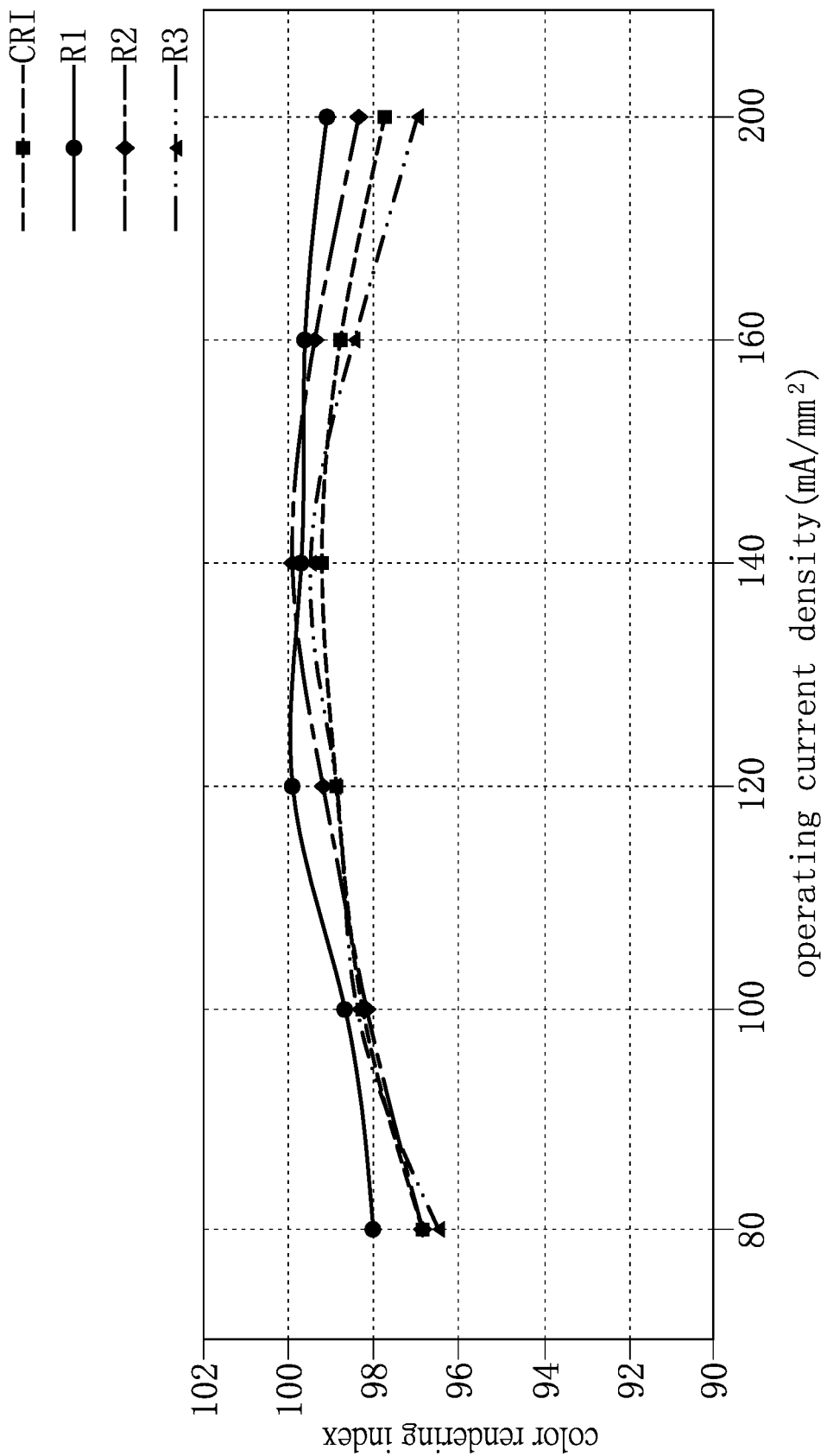
FIG. 17 is a curve diagram showing the variations of different color rendering indices of mixed light with different operating current densities of the light-emitting module according to an embodiment of the present disclosure.
Figure 18:
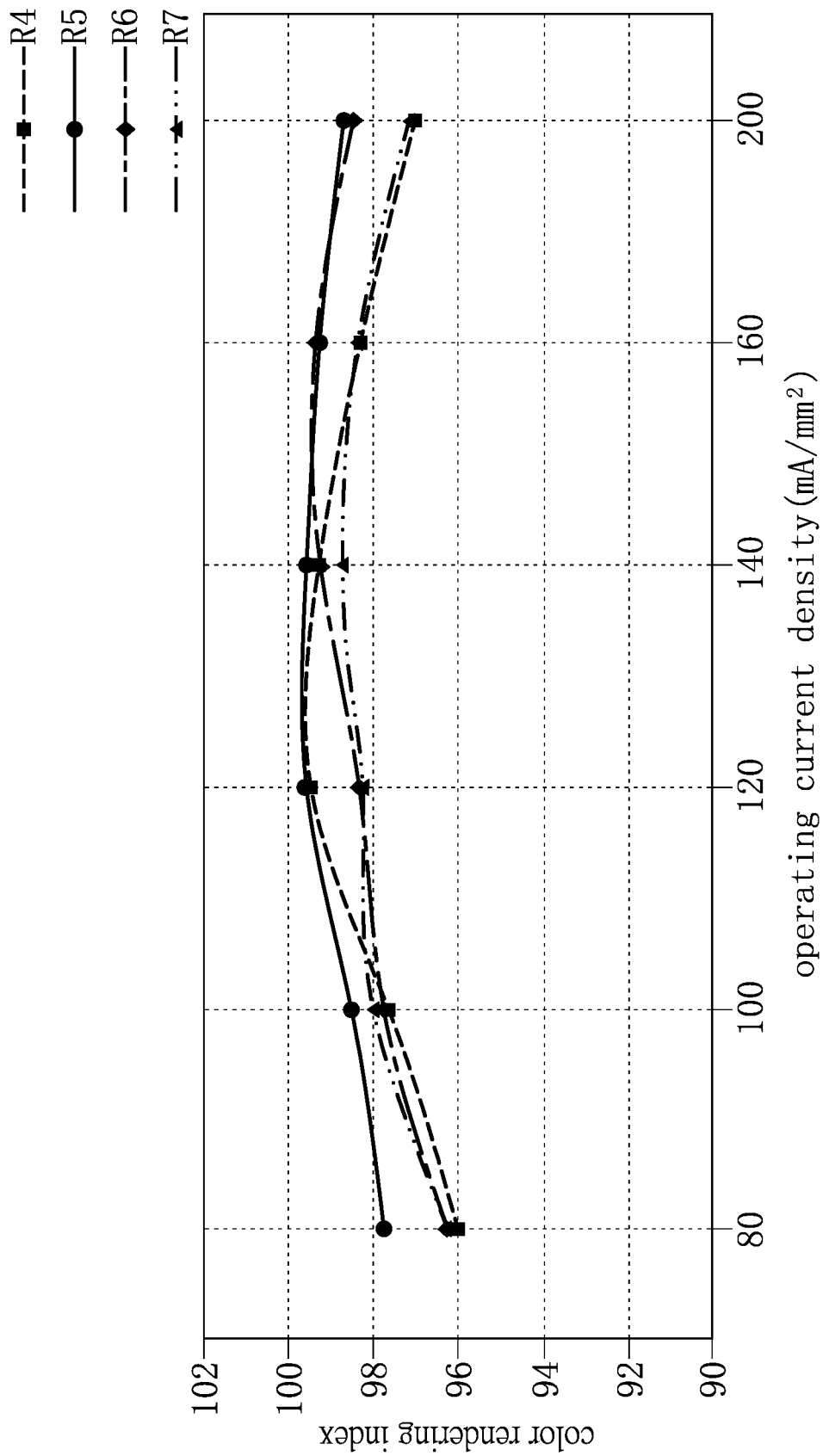
FIG. 18 is a curve diagram showing the variations of different color rendering indices of mixed light with different operating current densities of the light-emitting module according to an embodiment of the present disclosure.
Figure 19:
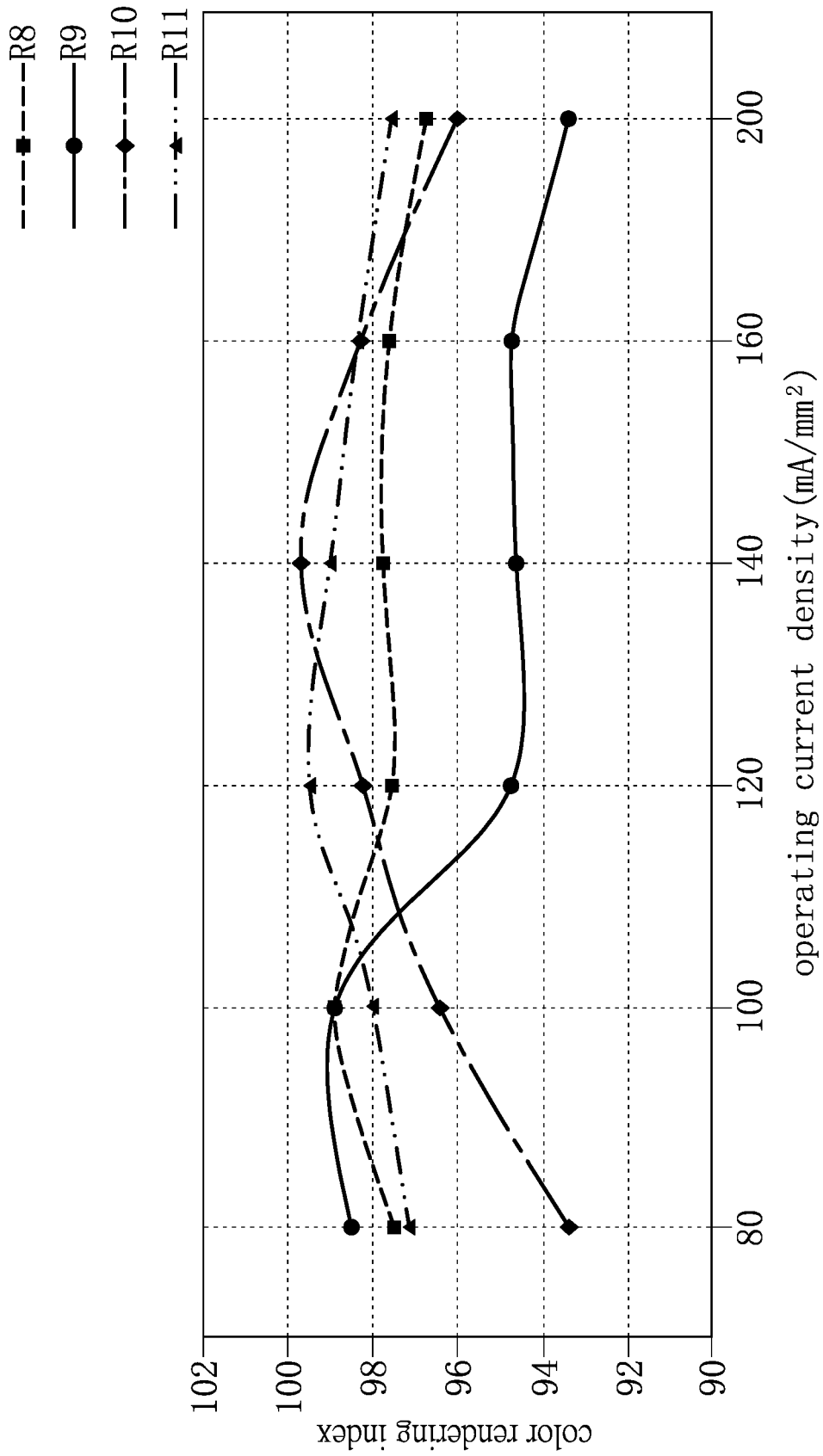
FIG. 19 is a curve diagram showing the variations of different color rendering indices of mixed light with different operating current densities of the light-emitting module according to an embodiment of the present disclosure.
Figure 20:
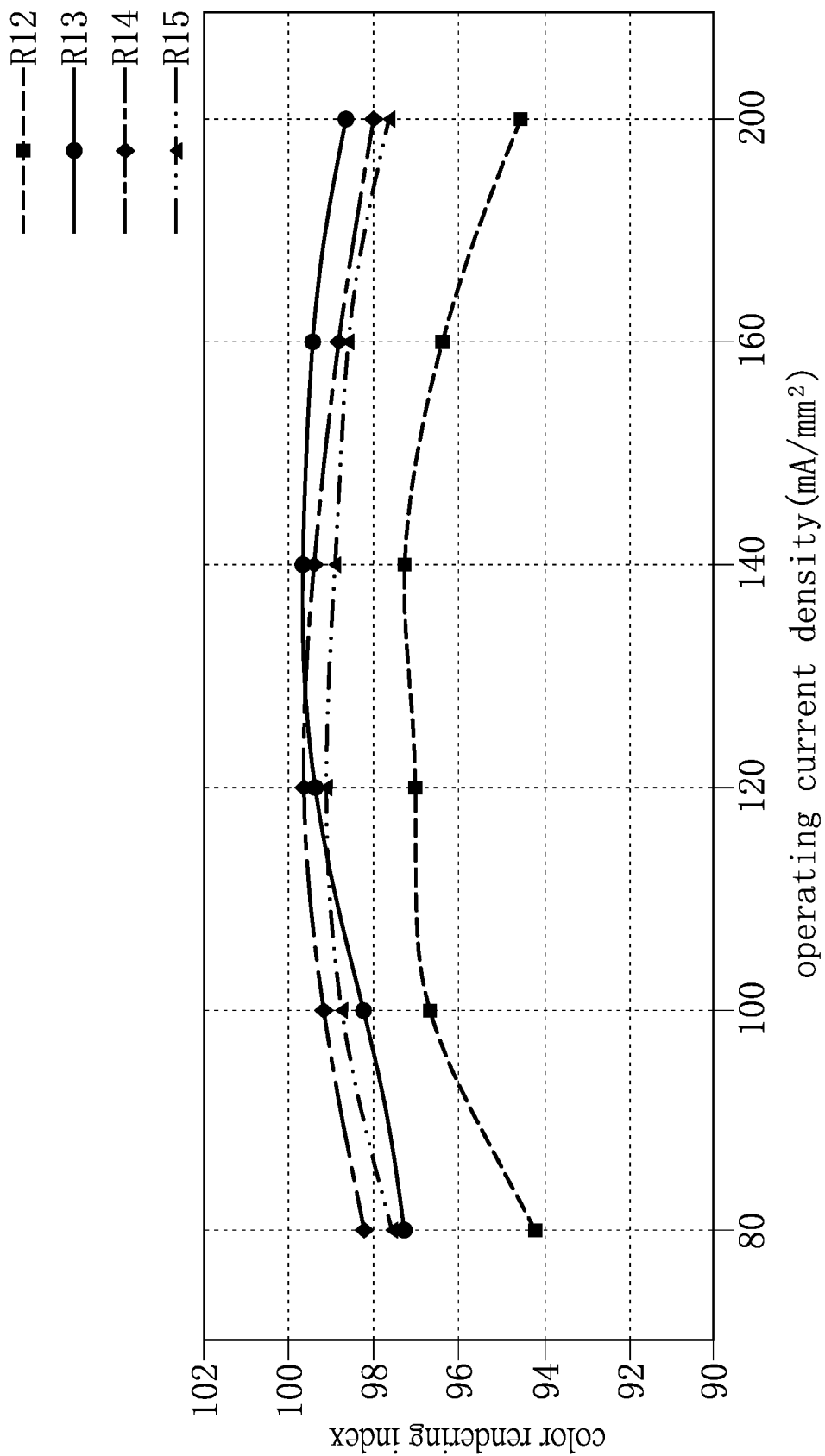
FIG. 20 is a curve diagram showing the variations of different color rendering indices of mixed light with different operating current densities of the light-emitting module according to an embodiment of the present disclosure.
Figure 21:
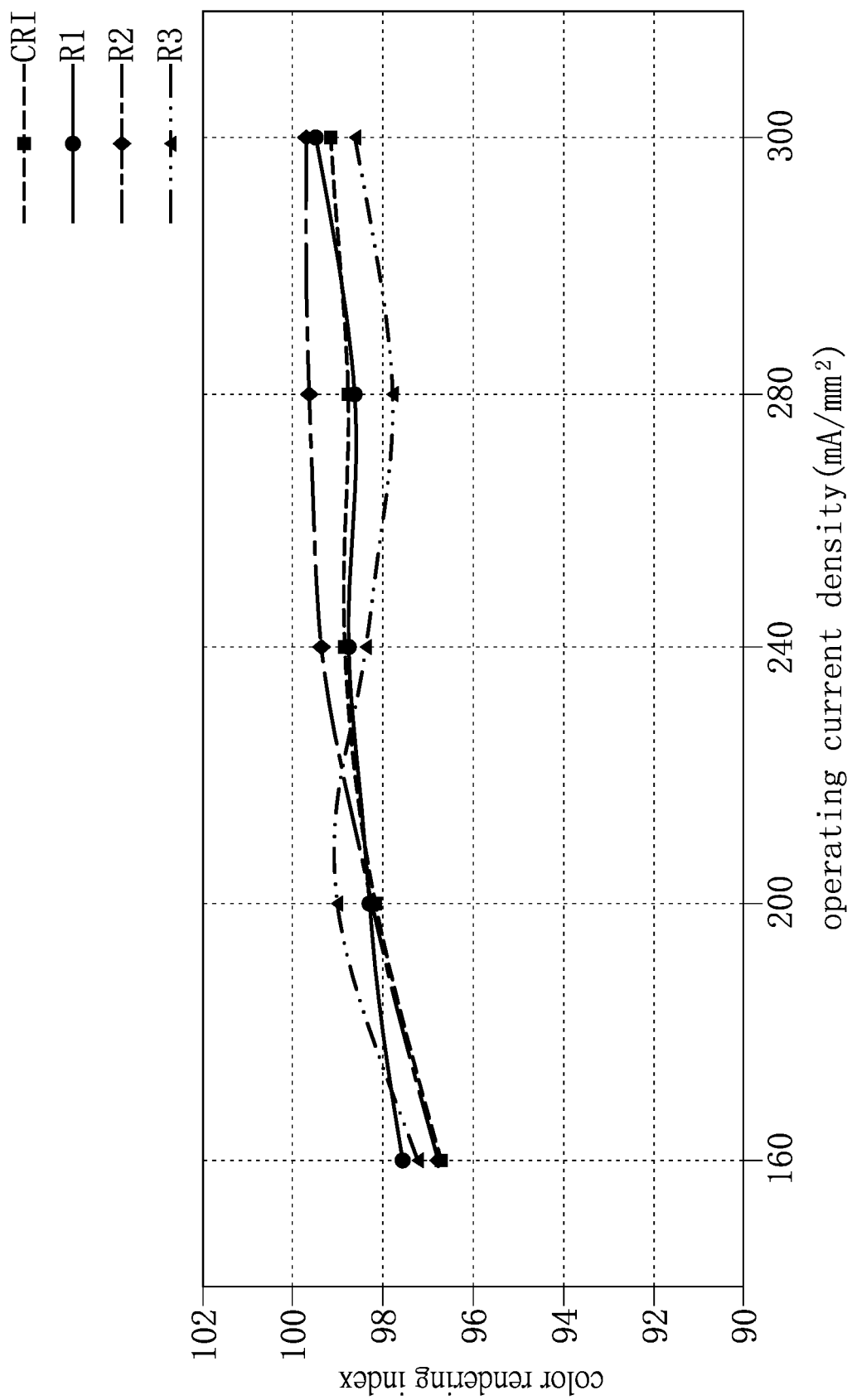
FIG. 21 is a curve diagram showing the variations of different color rendering indices of mixed light with different operating current densities of the light-emitting module according to an embodiment of the present disclosure.
Figure 22:
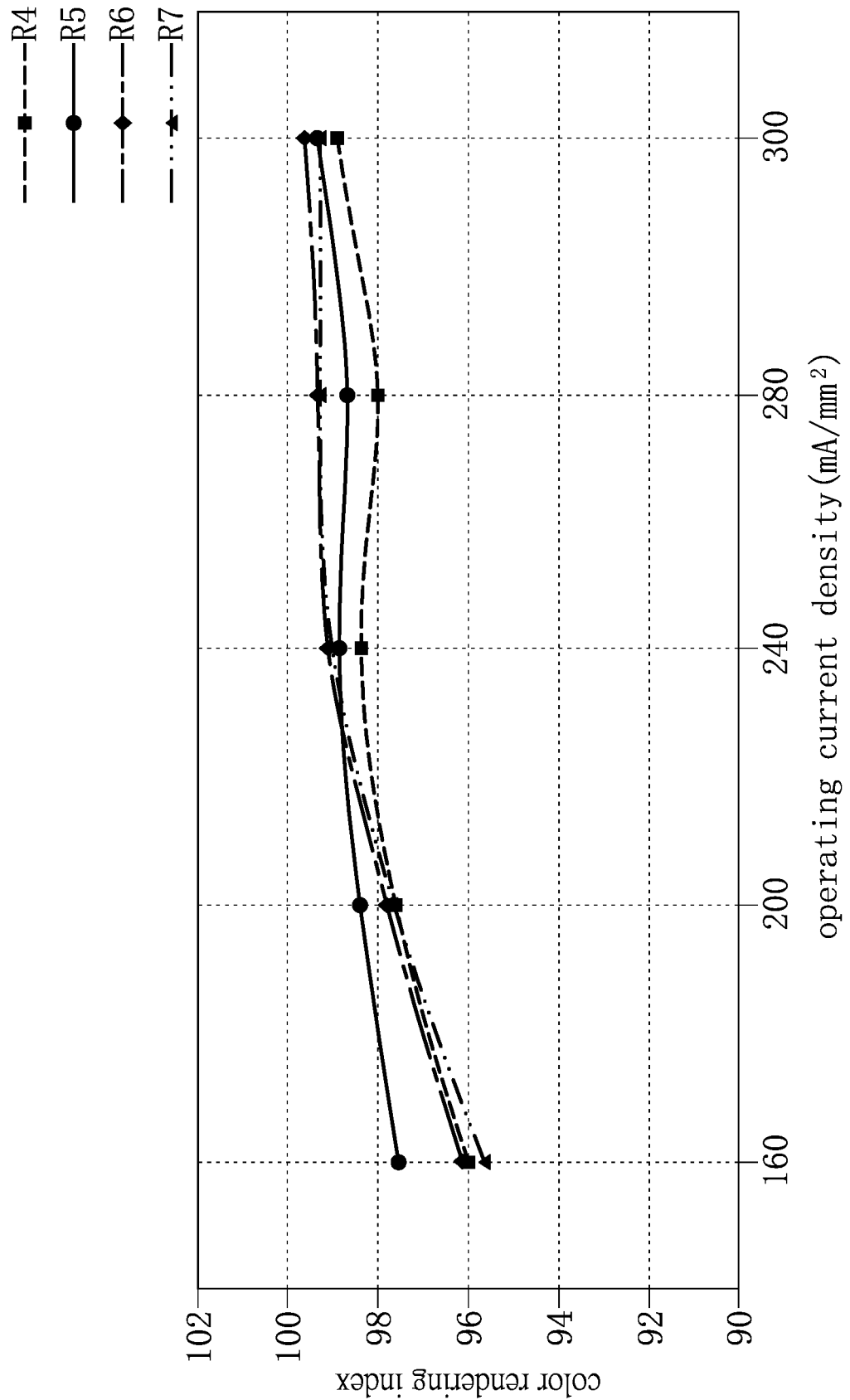
FIG. 22 is a curve diagram showing the variations of different color rendering indices of mixed light with different operating current densities of the light-emitting module according to an embodiment of the present disclosure.
Figure 23:
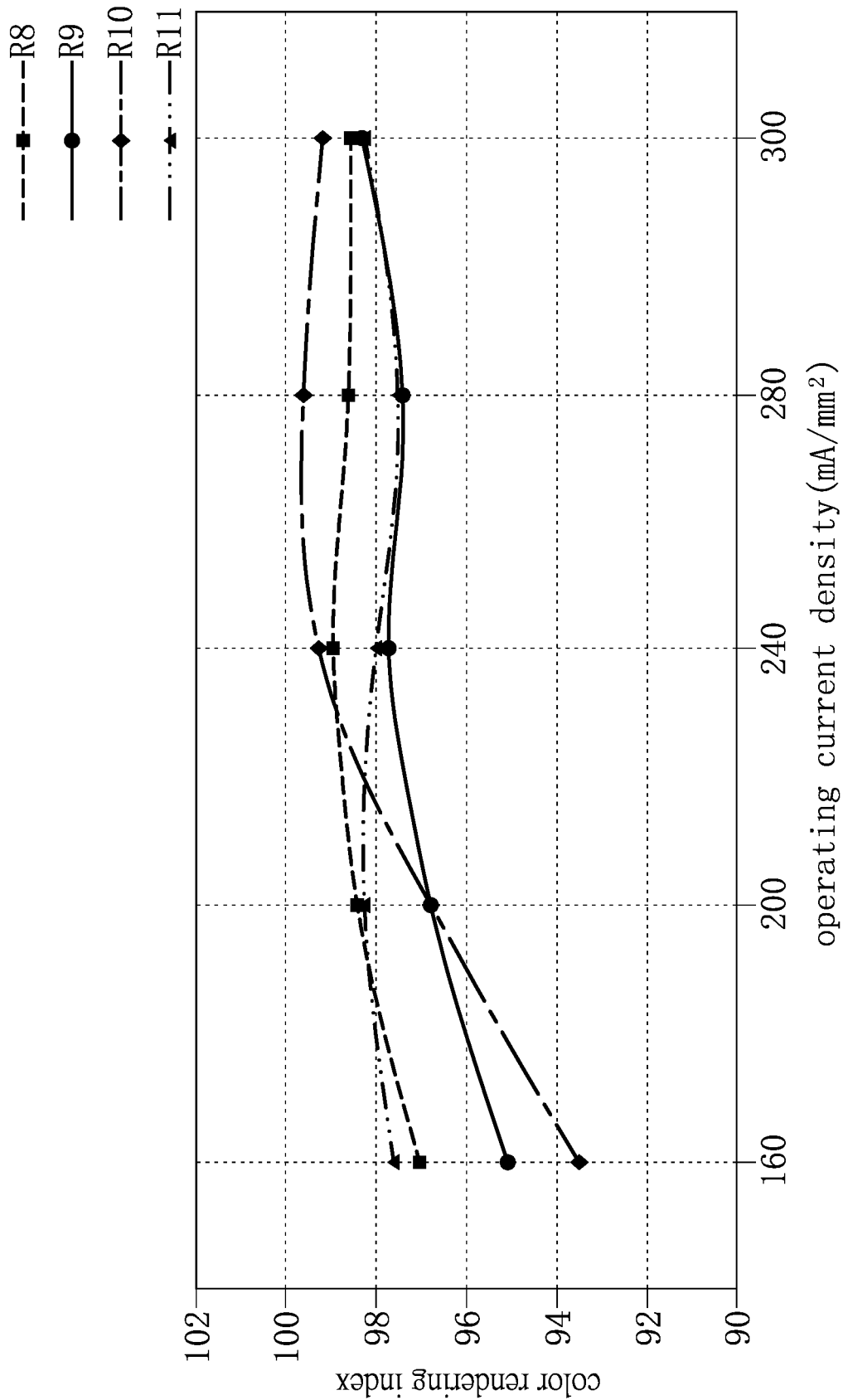
FIG. 23 is a curve diagram showing the variations of different color rendering indices of mixed light with different operating current densities of the light-emitting module according to an embodiment of the present disclosure.
Figure 24:
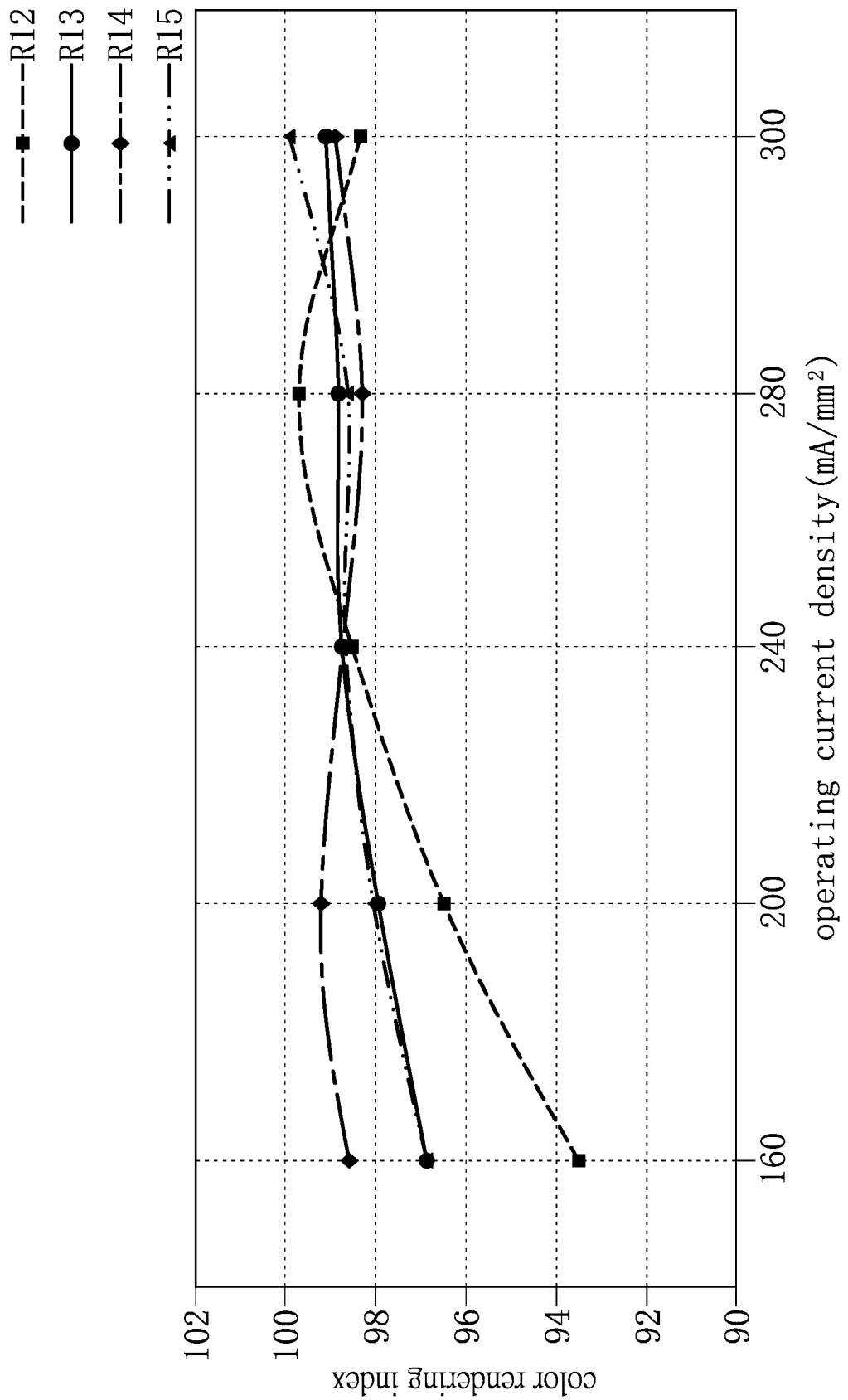
FIG. 24 is a curve diagram showing the variations of different color rendering indices of mixed light with different operating current densities of the light-emitting module according to an embodiment of the present disclosure.

Reference is made to FIG. 15 and FIG. 16, which show spectrum deviation indices of mixed light measured under different operating current densities of the light-emitting module according to an embodiment of the present disclosure. As described above, the spectrum deviation indices can be obtained by calculating a difference between a reference intensity ($I_s$) of the spectrum of the standard light and an intensity ($I_x$) of the white light spectrum of the mixed light, both of which correspond to the same wavelength (X x), and then dividing the difference ($I_x$–$I_s$) by the reference intensity ($I_s$) of the spectrum of the standard light at the same wavelength ($\lambda_x$). That is to say, for a certain wavelength ($\lambda_x$), a spectrum deviation index ($C_x$), the intensity ($I_x$) of the white light spectrum of the mixed light, the reference intensity ($I_s$) of the spectrum of the standard light satisfy the following equation: $C_x=(I_x-I_s)/I_s$.

Similarly, the white light spectrums that are measured under different operating current densities falling within a range from 160 mA/mm² to 300 mA/mm² are each normalized relative to the standard light by setting Y (one of the tristimulus values of CIE XYZ color space) as being equal to 100. After the white light spectrums are normalized, the spectrum deviation indices, which respectively correspond to different wavelengths, of each of the white light spectrums are calculated relative to the spectrum of the standard light. FIG. 15 shows the spectrum deviation indices of the white light spectrums of the mixed light, the white light spectrums being measured under different operating current densities of 160 mA/mm², 200 mA/mm², and 240 mA/mm². FIG. 16 shows the spectrum deviation indices of the white light spectrums of the mixed light, the white light spectrums being measured under different operating current densities of 280 mA/mm² and 300 mA/mm².

Reference is made to FIG. 15. When the operating current density is 160 mA/mm², each of the spectrum deviation indices of the white light spectrum varies in a range from –0.08 to 0.2 within a wavelength range of 450 nm to 500 nm relative to a spectrum of the standard light. Reference is made to FIG. 15. When the operating current density is 300 mA/mm², each of the spectrum deviation indices of the white light spectrum varies in a range from –0.12 to 0.22 within a wavelength range of 450 nm to 500 nm relative to a spectrum of the standard light.

Furthermore, any one of spectrum deviation indices of the (normalized) white light spectrums corresponding to a wavelength ranging from 450 nm to 500 nm has a variation smaller than or equal to 0.2, the white light spectrums being measured under different operating current densities of the light-emitting diode falling within a range from 160 mA/mm² to 300 mA/mm².

For example, for two of the (normalized) white light spectrums that are respectively measured under different operating current densities of 160 mA/mm² and 300 mA/mm², the spectrum deviation indices ($C_{160x}$ and $C_{300x}$) of the two white light spectrums corresponding to any one ($\lambda_x$) of wavelengths ranging from 450 nm to 500 nm have a difference less than or equal to 0.2.

Generally speaking, for any two of the (normalized) white light spectrums that are respectively measured under different operating current densities ranging from 80 mA/mm² to 300 mA/mm², the two spectrum deviation indices corresponding to the same wavelength ranging from 450 nm to 500 nm have a largest difference less than or equal to 0.42.

For example, relative to the spectrum of the standard light, the two white light spectrums respectively measured under different operating current densities of 80 mA/mm² and 300 mA/mm² have two spectrum deviation indices ($C_{80x}$ and $C_{00x}$ corresponding to any one of the wavelengths ranging from 450 nm to 500 nm, and a difference between the two spectrum deviation indices ($C_{80x}$ and $C_{300x}$) is less than or equal to 0.42.

Reference is made to FIG. 17 to FIG. 20, which are curve diagrams showing the variations of color rendering indices of mixed light with operating current density of the light-emitting module according to an embodiment of the present disclosure. Specifically, FIG. 17 to FIG. 20 show curves of the light-emitting module according to an embodiment of the present disclosure based on color rendering indices, which includes a general color rendering index CRI and special color rendering indices R1~R15 and are measured respectively under operating current densities of 80 mA/mm², 100 mA/mm², 120 mA/mm₂, 140 mA/mm², 160 mA/mm², and 200 mA/mm². Furthermore, in the present embodiment, the chip size of the light-emitting diode used in the light-emitting module is 26×30 mil².

When the operating current density of the light-emitting diode varies in a range from 80 mA/mm² to 200 mA/mm², the color rendering indices (including a general color rendering index CRI and special color rendering indices R1~R15) are all greater than 90. Furthermore, referring to the Table 2 below, Table 2 shows the relationships between the operating current density (mA/mm²) and the color rendering indices of the mixed light that includes a general color rendering index (CRI) and special color rendering indices (R1~R15).

TABLE 2

| operating current density (mA/mm²) | CRI | R1 | R2 | R3 | R4 | R5 | R6 | R7 |
|---|---|---|---|---|---|---|---|---|
| 80 | 96.9 | 98.1 | 96.9 | 96.5 | 96.0 | 97.7 | 96.3 | 96.2 |
| 100 | 98.3 | 98.6 | 98.2 | 98.4 | 97.7 | 98.5 | 97.7 | 98.0 |
| 120 | 98.9 | 99.9 | 99.2 | 98.9 | 99.5 | 99.5 | 98.3 | 98.2 |
| 140 | 99.2 | 99.7 | 99.9 | 99.5 | 99.3 | 99.5 | 99.2 | 98.7 |
| 160 | 98.8 | 99.6 | 99.4 | 98.4 | 98.3 | 99.3 | 99.3 | 98.3 |
| 200 | 97.8 | 99.1 | 98.4 | 97.0 | 97.0 | 98.7 | 98.5 | 97.2 |

| operating current density (mA/mm²) | R8 | R9 | R10 | R11 | R12 | R13 | R14 | R15 |
|---|---|---|---|---|---|---|---|---|
| 80 | 97.5 | 98.4 | 93.5 | 97.1 | 94.4 | 97.3 | 98.2 | 97.7 |
| 100 | 98.8 | 98.8 | 96.5 | 98.0 | 96.8 | 98.3 | 99.2 | 98.8 |
| 120 | 97.5 | 94.8 | 98.2 | 99.4 | 97.0 | 99.4 | 99.6 | 99.1 |
| 140 | 97.7 | 94.6 | 99.6 | 98.9 | 97.3 | 99.6 | 99.4 | 98.9 |
| 160 | 97.6 | 94.6 | 98.2 | 98.3 | 96.4 | 99.4 | 98.8 | 98.6 |
| 200 | 96.7 | 93.4 | 95.9 | 97.5 | 94.6 | 98.7 | 98.0 | 97.7 |

As shown in Table 2, when the operating current density varies in a range from 80 mA/mm² to 200 mA/mm², a variation of the general color rendering index is not more than 3, preferably less than 2.5. Furthermore, each of the special color indices R1~R15 has a variation that is not more than 7, preferably not more than 5.

Reference is made to FIG. 21 to FIG. 24, which are curve diagrams showing the variations of color rendering indices of mixed light with operating current density of the light-emitting module according to an embodiment of the present disclosure. Specifically, FIG. 21 to FIG. 24 show curves of the light-emitting module according to an embodiment of the present disclosure based on color rendering indices, which includes a general color rendering index CRI and special color rendering indices R1~R15 and are measured respectively under operating current densities of 160 mA/mm$^2$, 200 mA/mm$^2$, 240 mA/mm$_2$, 280 mA/mm$^2$, and 300 mA/mm$^2$. Furthermore, in the present embodiment, the chip size of the light-emitting diode used in the light-emitting module is 26×30 mil$^2$.

When the operating current density of the light-emitting diode varies in a range from 160 mA/mm$^2$ to 300 mA/mm$^2$, the color rendering indices (including a general color rendering index Ra and special color rendering indices R1~R15) are all greater than 90. Furthermore, referring to the Table 3 below, Table 3 shows the relationships between the operating current density (mA/mm$^2$) and the color rendering indices of the mixed light that includes a general color rendering index (CRI or Ra) and special color rendering indices (R1~R15).

TABLE 3

| operating current density (mA/mm$^2$) | Color Rendering Indices |  |  |  |  |  |  |
|---|---|---|---|---|---|---|---|
|  | CRI | R1 | R2 | R3 | R4 | R5 | R6 | R7 |
| 160 | 96.8 | 97.6 | 96.9 | 97.2 | 96.0 | 97.5 | 96.1 | 95.7 |
| 200 | 98.2 | 98.3 | 98.3 | 99.0 | 97.6 | 98.3 | 97.8 | 97.6 |
| 240 | 98.8 | 98.7 | 99.4 | 98.4 | 98.3 | 98.8 | 99.0 | 99.0 |
| 280 | 98.7 | 98.6 | 99.7 | 97.8 | 98.0 | 98.7 | 99.3 | 99.3 |
| 300 | 99.2 | 99.5 | 99.7 | 98.6 | 98.9 | 99.3 | 99.6 | 99.3 |

| operating current density (mA/mm$^2$) | Color Rendering Indices |  |  |  |  |  |  |
|---|---|---|---|---|---|---|---|
|  | R8 | R9 | R10 | R11 | R12 | R13 | R14 | R15 |
| 160 | 97.1 | 95.1 | 93.5 | 97.6 | 93.6 | 96.9 | 98.6 | 96.9 |
| 200 | 98.4 | 96.8 | 96.8 | 98.3 | 96.4 | 97.9 | 99.2 | 98.0 |
| 240 | 99.0 | 97.7 | 99.3 | 98.1 | 98.6 | 98.7 | 98.7 | 98.7 |
| 280 | 98.6 | 97.4 | 99.6 | 97.5 | 99.6 | 98.9 | 98.3 | 98.6 |
| 300 | 98.5 | 98.3 | 99.2 | 98.3 | 98.3 | 99.1 | 98.9 | 99.8 |

As shown in Table 3, when the operating current density varies in a range from 160 mA/mm$^2$ to 300 mA/mm$^2$, a variation of the general color rendering index is not more than 3, and preferably less than 2.5. Furthermore, each of the special color indices R1~R15 has a variation that is not more than 10, and preferably not more than 7.

Accordingly, when the operating current applied to the light-emitting diode is varied, the spectrum waveform of the white light spectrum of the mixed light generated by the light-emitting module Z1 of the embodiment provided in the present disclosure at the blue light wavelength band has a better stability. Furthermore, when the operating current density is changed within a range from 80 mA/mm$^2$ to 300 mA/mm$^2$, the variations of the color rendering indices of the mixed light, which includes the general color rendering index and the special color rendering indices, do not exceed 10, and preferably do not exceed 7.

Furthermore, the hot/cold factor of the light-emitting diode Z12 under different operating current densities can also be improved. In the instant embodiment, the hot/cold factors of the light-emitting diode Z12 measured under the operating current densities of 120 mA/mm$^2$ and 300 mA/mm$^2$ are 91% and 89.5%, respectively. The aforementioned hot/cold factor is defined as a ratio of the light output (luminous flux) of the light-emitting diode Z12 at high temperature (about 85° C.) to that at a normal temperature (about 25° C.). Based on the above-mentioned, it is difficult for the hot/cold factor of the light-emitting diode Z12 in the embodiment of the present disclosure to be varied with the variation of the operating current density.

In conclusion, one of the advantages of the present disclosure is that in the light-emitting diode Z12 of the light-emitting module Z1 of the embodiment provided in the present disclosure, by the technical features of "the epitaxial light-emitting structure generating a light beam with a broadband blue spectrum, in which the broadband blue spectrum has a FWHM larger than or equal to 30 nm and a plurality of peak inflection points, and a difference between two wavelength values to which any two adjacent ones of the peak inflection points respectively correspond is less than or equal to 18 nm," the negative affect resulting from a variation of the operating current density on the spectrum waveform of the white light spectrum of the mixed light generated by the light-emitting module Z1 can be attenuated. That is to say, the spectrum waveform at the blue light wavelength band has a better stability even if the operating current density is changed.

As mentioned above, when the operating current density falls within a range from 80 mA/mm$^2$ to 300 mA/mm$^2$, a variation of each of the color rendering indices (including the general color rendering index and the special color rendering indices) of the mixed light does not exceed 7, thereby satisfying the application requirements in the industry.

Furthermore, in the light-emitting diode Z12 of the embodiment provided in the present disclosure, by the technical features of "the light-emitting stack of the epitaxial light-emitting structure including m layers of well layers 321 and m+1 layers of barrier layers 320 which are alternately stacked, in which the well layers 321 includes at least five well layers with different energy band gaps, being the first to fifth well layers 321a~321e, to generate first to fifth sub-light beams with different wavelengths" and "at least one of x number of the well layers that are the closest to the N-type semiconductor layer being the fifth well layer, x and m each being a positive integer, and satisfying the following equation: $x \leq (m/3)$," the light beam with the broadband blue spectrum can be generated.

Furthermore, the hot/cold factor of the light-emitting diode Z12 of the embodiment provided in the present disclosure under different operating current densities can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode comprising a light-emitting structure to generate a light beam with a broadband blue spectrum, and a spectrum waveform of the broadband blue spectrum has a plurality of peak inflection points, wherein the plurality of peak inflection points include a second peak inflection point with a second wavelength and a second intensity, a third peak inflection point with a third wavelength and a third intensity, a fourth peak inflection point with a fourth wavelength and a fourth intensity, a fifth peak inflection point with a fifth wavelength and a fifth intensity, wherein the second wavelength ranges from 430 nm to 450 nm, the third wavelength ranges from 442 nm to 465 nm, the fourth wavelength ranges from 455 nm to 475 nm, and wherein a ratio of the third intensity to the second intensity ranges from 0.4 to 1.4, a ratio of the fourth intensity to the second intensity ranges from 0.2 to 1.2, and a ratio of the fifth intensity to the second intensity ranges from 0.1 to 0.8.

2. The light-emitting diode according to claim 1, wherein a full width at half maximum (FWHM) of a spectrum waveform of the broadband blue spectrum is larger than or equal to 30 nm, and a wavelength difference between any two adjacent ones of the plurality of peak inflection points is less than or equal to 18 nm.

3. The light-emitting diode according to claim 1, wherein the plurality of peak inflection points include a first peak inflection point with a first wavelength value and a first intensity, wherein the first wavelength value is less than or equal to 435 nm, wherein a ratio of the first intensity to the second intensity ranges from 0.2 to 0.8.

4. The light-emitting diode according to claim 1, wherein the light-emitting structure includes:
a P-type semiconductor layer;
an N-type semiconductor layer; and
a light-emitting stack interposed between the P-type semiconductor layer and the N-type semiconductor layer and including m layers of well layers and m+1 layers of barrier layers which are alternately stacked, wherein the well layers include at least one second well layer, at least one third well layer, at least one fourth well layer, and at least one fifth well layer, wherein a second indium concentration of the at least one second well layer is lower than a third indium concentration of the at least one third well layer and a fourth indium concentration of the at least one fourth well layer, and a fifth indium concentration of the fifth at least one well layer is the highest among all well layers.

5. The light-emitting diode according to claim 4, wherein at least one of x number of the well layers that are the closest to the N-type semiconductor layer is the at least one fifth well layer, and satisfying the following equation: x≤(m/3).

6. The light-emitting diode according to claim 4, wherein the third wavelength is shorter than the fourth wavelength, and the at least one third well layer is located at a position closer to the P-type semiconductor layer than a position of the at least one fourth well layer.

7. The light-emitting diode according to claim 4, wherein the third wavelength is shorter than the fourth wavelength, and the at least one fourth well layer is located at a position closer to the P-type semiconductor layer than a position of the at least one third well layer.

8. The light-emitting diode according to claim 4, wherein the well layers include at least one first well layer, wherein a first indium concentration of the at least one first well layer is the lowest one among indium concentrations of all of the well layers.

9. The light-emitting diode according to claim 8, wherein a quantity of the at least one first well layer is plural, y number of the well layers that are closest to the P-type semiconductor layer are the first well layers, and y and m satisfy the following equation: y≥(m/4).

10. The light-emitting diode according to claim 9, wherein the third wavelength is shorter than the fourth wavelength and the at least one third well layer is located at a position closer to the P-type semiconductor layer than a position of the at least one fourth well layer.

11. The light-emitting diode according to claim 10, wherein a quantity of the at least one second well layer is plural, and all of the well layers located between the at least one third well layer and the well layer that is the yth closest to the P-type semiconductor layer are the second well layers.

12. The light-emitting diode according to claim 9, wherein the third wavelength is shorter than the fourth wavelength, and the at least one fourth well layer is located at a position closer to the P-type semiconductor layer than a position of the at least one third well layer.

13. The light-emitting diode according to claim 11, wherein all of the well layers located between the at least one fourth well layer and the well layer that is the yth closest to the P-type semiconductor layer are the second well layers.

14. The light-emitting diode according to claim 4, wherein the barrier layers include a plurality of first barrier layers and a plurality of second barrier layers, each of the first plurality of barrier layers has a thickness smaller than a thickness of each of the second plurality of barrier layers, and both the barrier layers that are respectively connected to two opposite sides of the at least one fifth well layer are the plurality of second barrier layers.

15. The light-emitting diode according to claim 13, wherein one of the barrier layers that is connected to the at least one fourth well layer and closer to the N-type semiconductor layer is the plurality of first barrier layer.

* * * * *